United States Patent
Haller

(10) Patent No.: US 10,985,252 B2
(45) Date of Patent: Apr. 20, 2021

(54) INTEGRATED ASSEMBLIES, AND METHODS OF FORMING INTEGRATED ASSEMBLIES

(71) Applicant: Micron Technology, Inc., Boise, ID (US)

(72) Inventor: Gordon A. Haller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/550,638

(22) Filed: Aug. 26, 2019

(65) Prior Publication Data

US 2021/0066460 A1    Mar. 4, 2021

(51) Int. Cl.

| | |
|---|---|
| H01L 21/02 | (2006.01) |
| H01L 21/225 | (2006.01) |
| H01L 21/28 | (2006.01) |
| H01L 23/532 | (2006.01) |
| H01L 27/11556 | (2017.01) |
| H01L 27/11582 | (2017.01) |

(52) U.S. Cl.
CPC .. *H01L 29/40117* (2019.08); *H01L 21/02129* (2013.01); *H01L 21/02131* (2013.01); *H01L 21/02164* (2013.01); *H01L 21/02532* (2013.01); *H01L 21/02636* (2013.01); *H01L 21/2251* (2013.01); *H01L 23/53257* (2013.01); *H01L 27/11556* (2013.01); *H01L 27/11582* (2013.01); *H01L 29/40114* (2019.08); *H01L 21/0217* (2013.01)

(58) Field of Classification Search
CPC ......... H01L 29/40117; H01L 29/40114; H01L 21/02129; H01L 21/02131; H01L 21/02164; H01L 21/0217; H01L 21/02532; H01L 21/02636; H01L 21/2251; H01L 23/53257; H01L 27/11556; H01L 27/11582
USPC ....................................................... 257/314
See application file for complete search history.

(56) References Cited

U.S. PATENT DOCUMENTS

| | | | |
|---|---|---|---|
| 9,627,405 | B1 | 4/2017 | Lee |
| 9,741,737 | B1 | 8/2017 | Huang et al. |
| 9,941,298 | B2 | 4/2018 | Huang et al. |
| (Continued) | | | |

FOREIGN PATENT DOCUMENTS

WO    WO    11/2020
PCT/US2020/043390

*Primary Examiner* — Tong-Ho Kim
(74) *Attorney, Agent, or Firm* — Wells St. John P.S.

(57) ABSTRACT

Some embodiments include a method of forming an integrated assembly. A first stack is formed over a conductive structure. The first stack includes a second layer between first and third layers. The first and third layers are conductive. A first opening is formed through the first stack. A sacrificial material is formed within the first opening. A second stack is formed over the first stack. The second stack has alternating first and second levels. A second opening is formed through the second stack and through the sacrificial material. First semiconductor material is formed within the second opening. A third opening is formed through the second stack, through the third layer, and to the second layer. The second layer is removed, forming a conduit. Second semiconductor material is formed within the conduit. Dopant is out-diffused from the second semiconductor material into the first semiconductor material. Some embodiments include integrated assemblies.

45 Claims, 24 Drawing Sheets

(56) References Cited

U.S. PATENT DOCUMENTS

| | | |
|---|---|---|
| 10,211,222 B1 * | 2/2019 | Yamanaka ............ H01L 29/456 |
| 10,236,301 B1 | 3/2019 | Howder et al. |
| 2018/0226427 A1 * | 8/2018 | Huang ................ H01L 27/1157 |
| 2018/0261671 A1 | 9/2018 | Matsumoto et al. |
| 2018/0323213 A1 | 11/2018 | Arai |
| 2018/0366483 A1 | 12/2018 | Choi |
| 2019/0067312 A1 * | 2/2019 | Arisumi ............ H01L 27/11565 |
| 2019/0081063 A1 | 3/2019 | Yamanaka |
| 2020/0235112 A1 | 7/2020 | Howder et al. |

\* cited by examiner

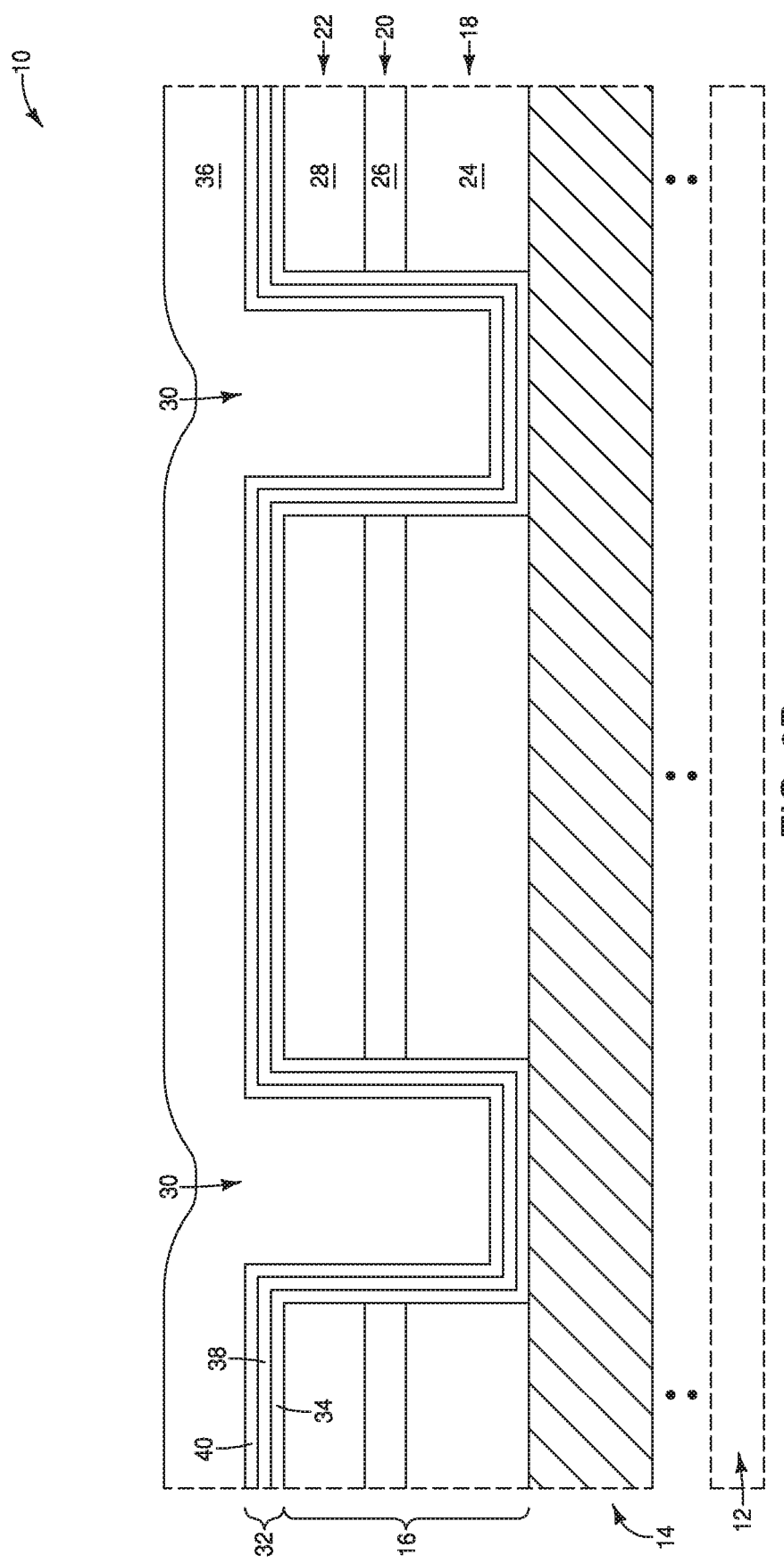

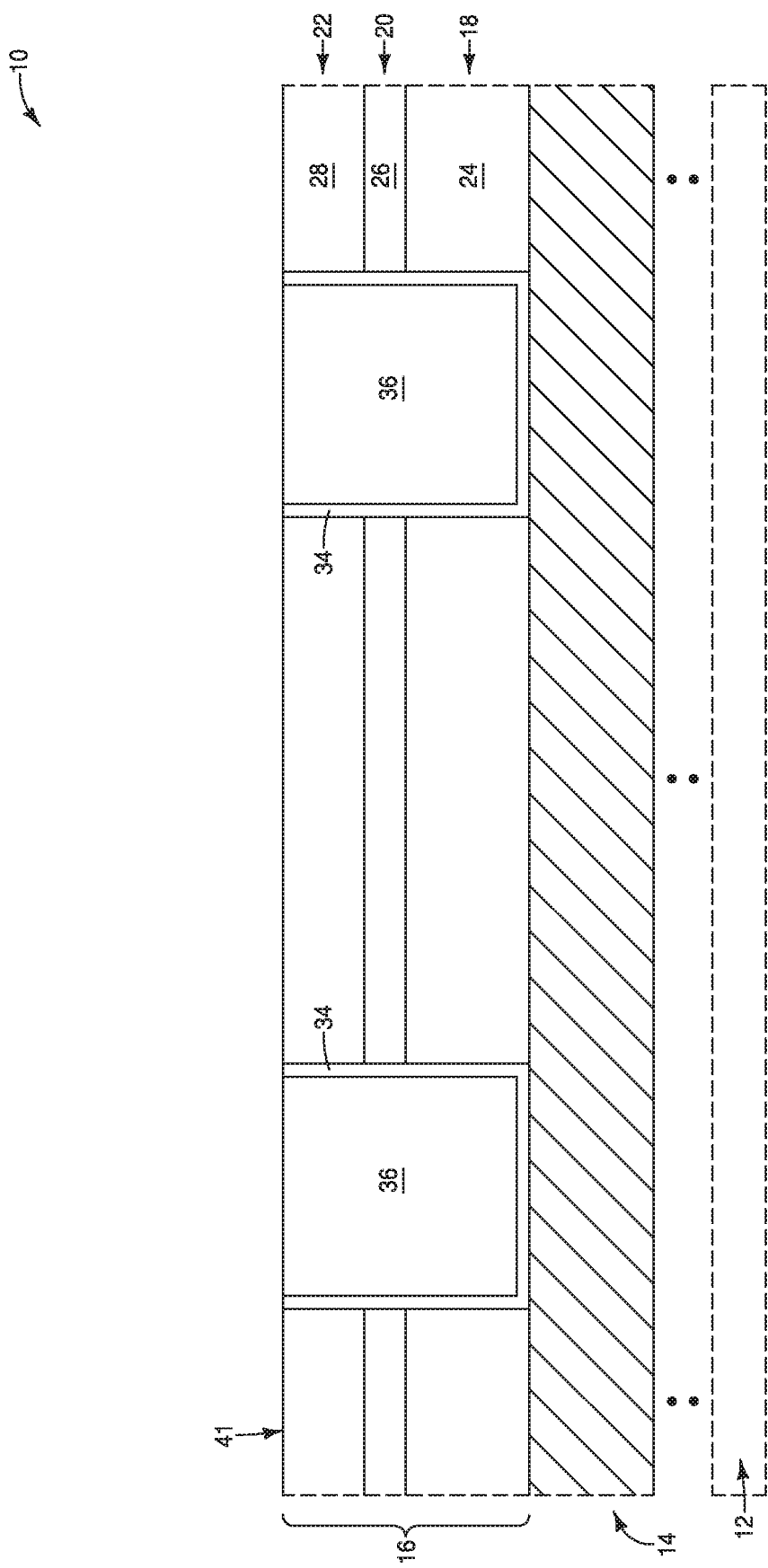

INTEGRATED ASSEMBLIES, AND METHODS OF FORMING INTEGRATED ASSEMBLIES

TECHNICAL FIELD

Methods of forming integrated assemblies (e.g., integrated memory devices). Integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_J$ and tile column$_K$, with each subset (e.g., tile column) comprising a "partial block" (sub-block) of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

The vertically-stacked memory cells of three-dimensional NAND architecture may be block-erased by generating hole carriers beneath them, and then utilizing an electric field to sweep the hole carriers upwardly along the memory cells.

Gating structures of transistors may be utilized to provide gate-induced drain leakage (GIDL) which generates the holes utilized for block-erase of the memory cells. The transistors may be the source-side select (SGS) devices described above. The channel material associated with a string of memory cells may be configured as a channel material pillar, and a region of such pillar may be gatedly coupled with an SGS device. The gatedly coupled portion of the channel material pillar is a portion that overlaps a gate of the SGS device.

It can be desired that at least some of the gatedly coupled portion of the channel material pillar be heavily doped. In some applications it can be desired that the gatedly coupled portion include both a heavily-doped lower region and a lightly-doped upper region; with both regions overlapping the gate of the SGS device. Specifically, overlap with the lightly-doped region provides a non-leaky "OFF" characteristic for the SGS device, and overlap with the heavily-doped region provides leaky GIDL characteristics for the SGS device. The terms "heavily-doped" and "lightly-doped" are utilized in relation to one another rather than relative to specific conventional meanings. Accordingly, a "heavily-doped" region is more heavily doped than an adjacent "lightly-doped" region, and may or may not comprise heavy doping in a conventional sense. Similarly, the "lightly-doped" region is less heavily doped than the adjacent "heavily-doped" region, and may or may not comprise light doping in a conventional sense. In some applications, the term "lightly-doped" refers to semiconductor material having less than or equal to about $10^{18}$ atoms/cm$^3$ of dopant, and the term "heavily-doped" refers to semiconductor material having greater than or equal to about $10^{22}$ atoms/cm$^3$ of dopant.

The channel material may be initially doped to the lightly-doped level, and then the heavily-doped region may be formed by out-diffusion from an underlying doped semiconductor material.

It is desired to develop improved methods of achieve desired heavily-doped regions of channel material pillars.

BRIEF DESCRIPTION OF THE DRAWINGS

FIGS. 6A and 6B are diagrammatic cross-sectional side views of the integrated assembly at process stages which may be alternative to that of FIG. 6.

FIGS. 7-20 are diagrammatic cross-sectional side views of the example integrated assembly at sequential process stages following the process stage of FIG. 6. The example memory device is illustrated in FIG. 20.

DETAILED DESCRIPTION OF THE ILLUSTRATED EMBODIMENTS

Some embodiments include new methods of forming memory devices having vertically-stacked memory cell levels over a conductive source structure. The memory devices include at least one select device level (e.g., at least one SGS device level) between the memory cells levels and the conductive source structure. Channel material extends vertically along the memory cell levels and the select device level. A sacrificial material is initially provided in a region of the conductive source structure. The sacrificial material is replaced with conductively-doped semiconductor material, and dopant is out-diffused from the conductively-doped semiconductor material into a lower region of the channel material. The dopant within the lower region of the channel material may be provided to a desired location and concentration to form the doped region(s) of the select device level(s). Example embodiments are described below with reference to FIGS. 5-21.

Figure 1:
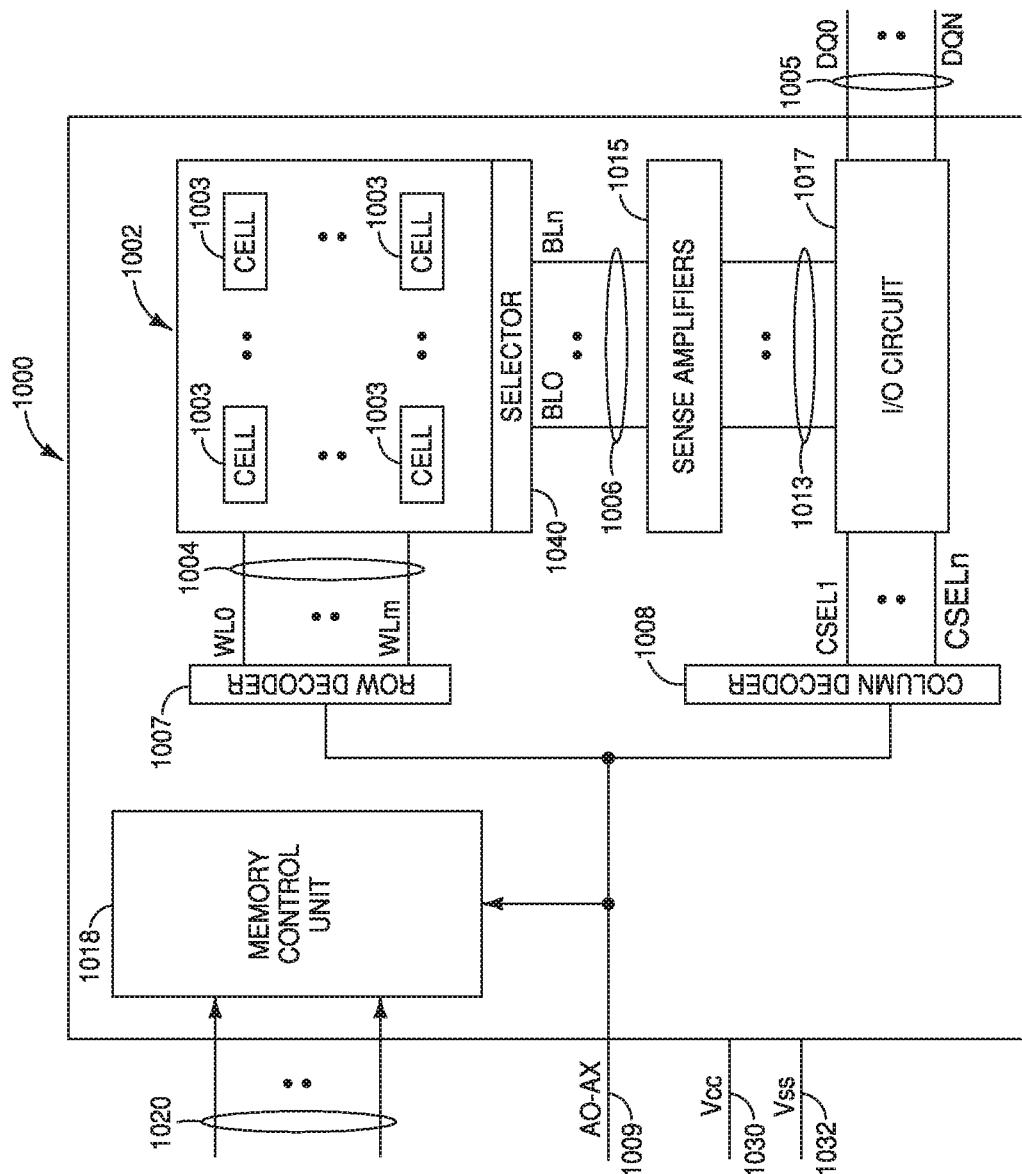
FIG. 1 shows a block diagram of a prior art memory device having a memory array with memory cells.
Figure 2:
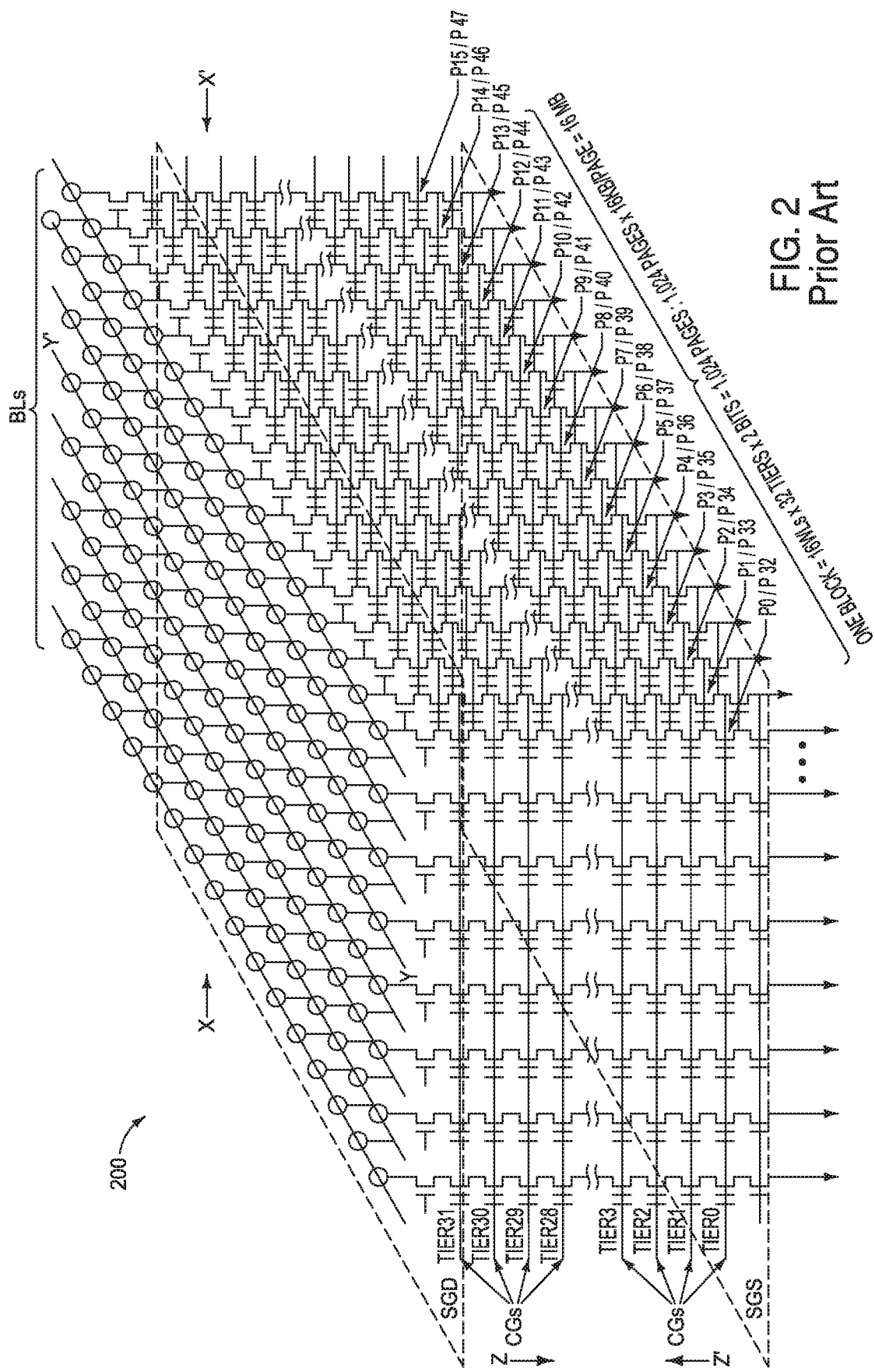
FIG. 2 shows a schematic diagram of the prior art memory device of FIG. 1 in the form of a 3D NAND memory device.
Figure 3:
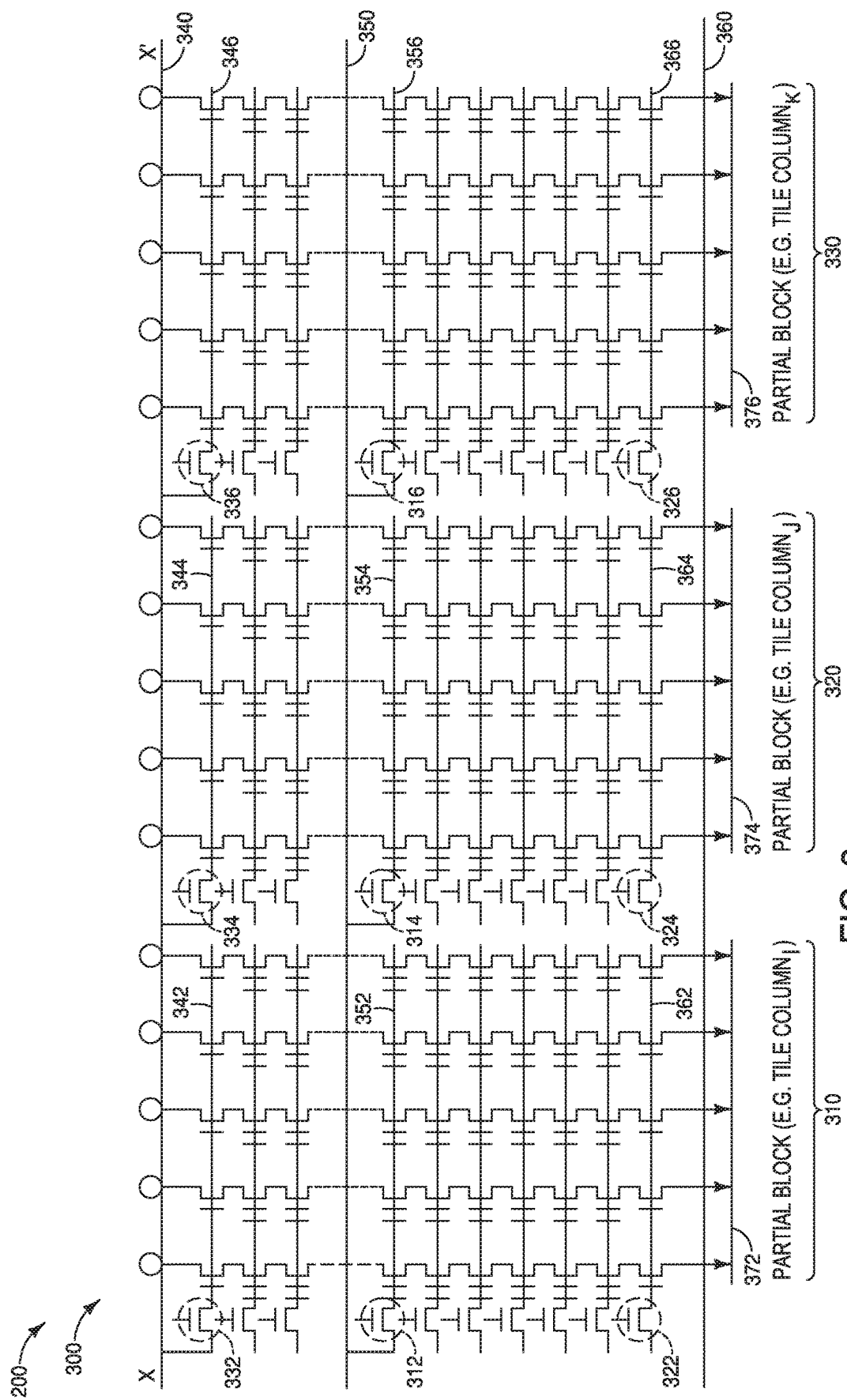
FIG. 3 shows a cross-sectional view of the prior art 3D NAND memory device of FIG. 2 in an X-X' direction.
Figure 4:
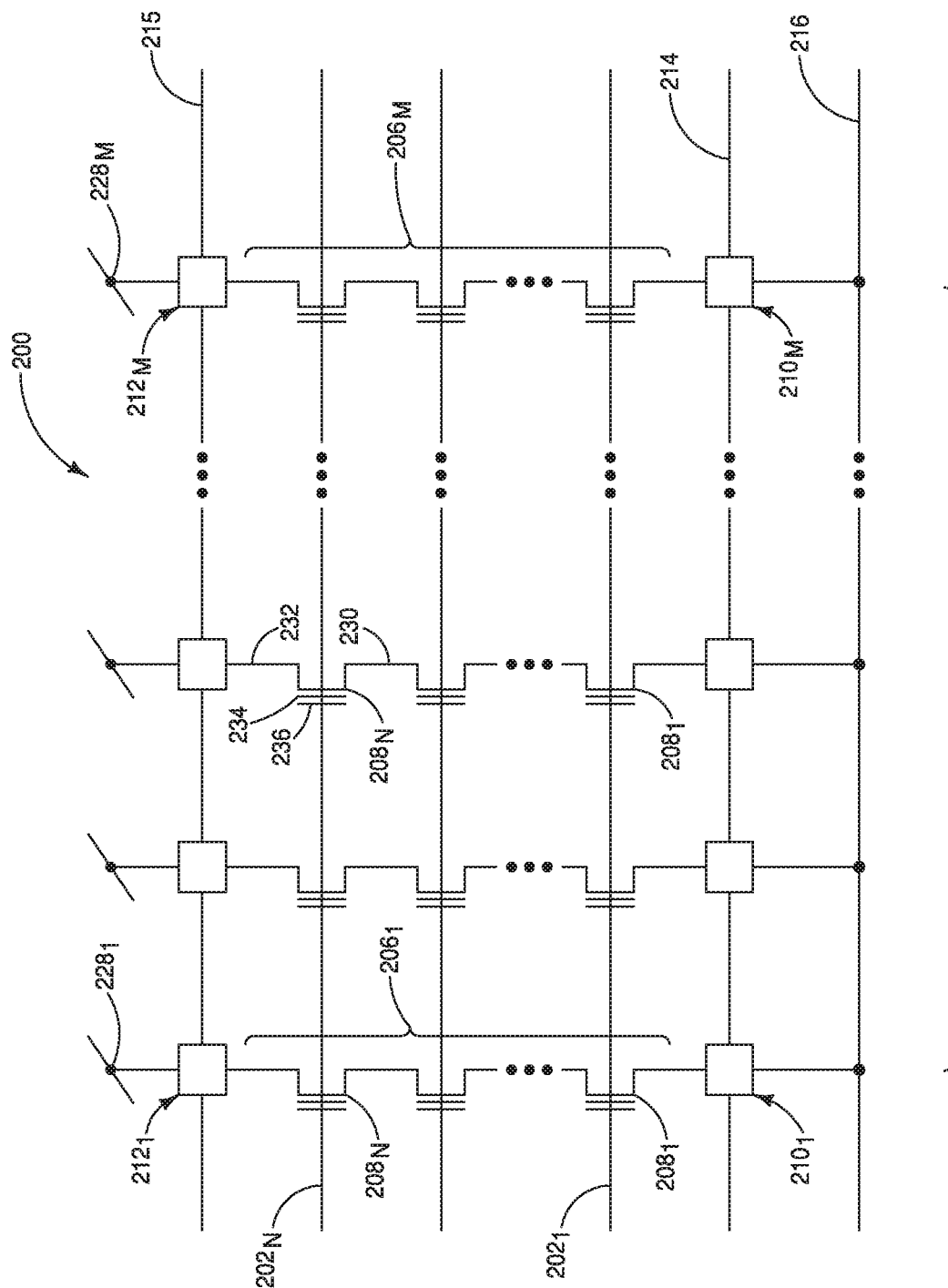
FIG. 4 is a schematic diagram of a prior art NAND memory array.
Figure 5:
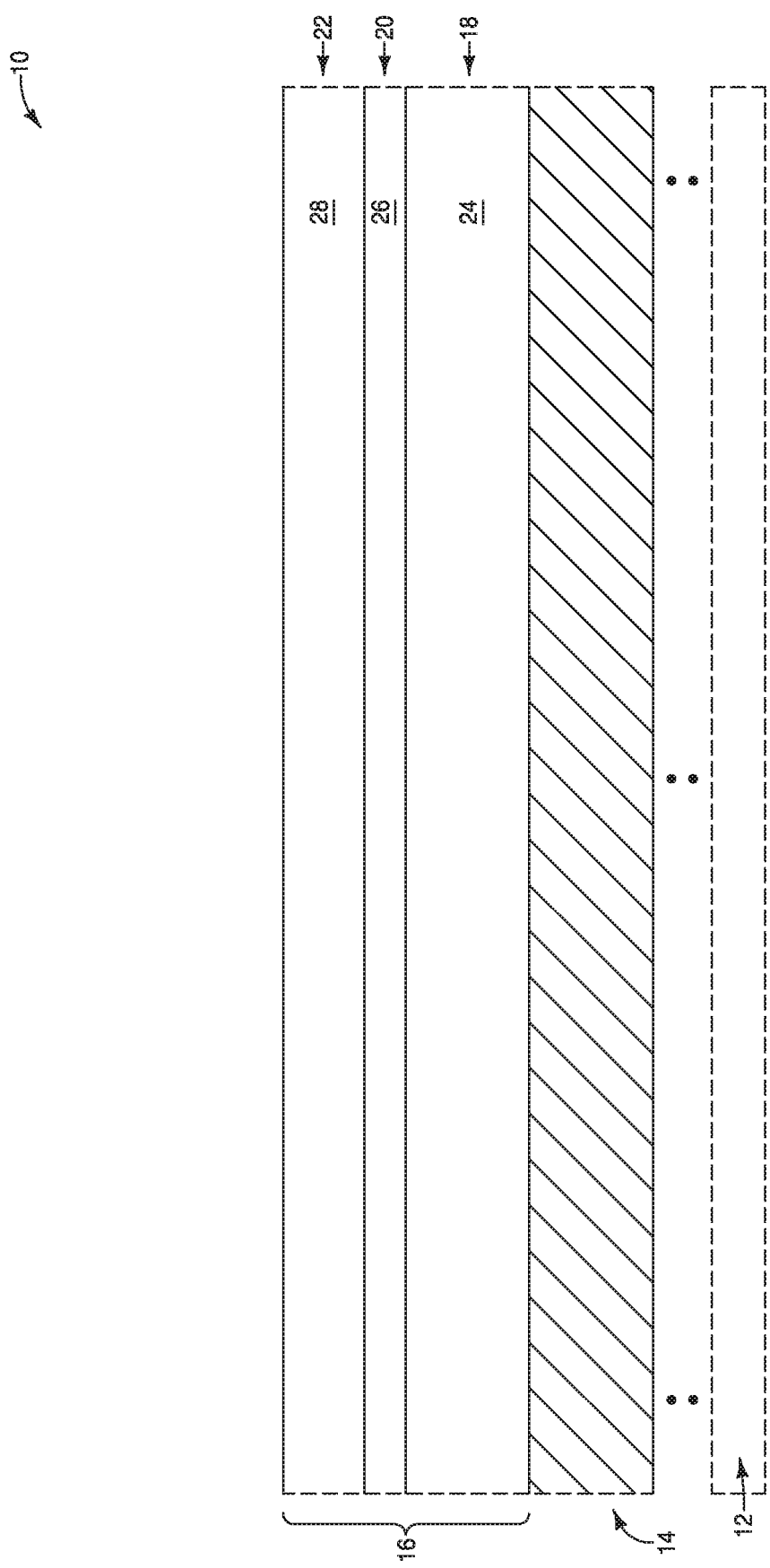
FIGS. 5 and 6 are diagrammatic cross-sectional side views of a region of an example integrated assembly at example sequential process stages of an example embodiment method for fabricating an example memory device.

Referring to FIG. 5, an integrated assembly 10 includes a conductive structure 14 over a base 12.

The base 12 may comprise semiconductor material; and may, for example, comprise, consist essentially of, or consist of monocrystalline silicon (Si). The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

A gap is provided between the base 12 and the conductive structure 14 to indicate that there may be other materials, devices, etc., between the base 12 and the conductive structure 14.

The conductive structure 14 may comprise any suitable electrically conductive composition(s); such as, for example, one or more of various metals (e.g., titanium (Ti), tungsten (W), cobalt (Co), nickel (Ni), platinum (Pt), ruthenium (Ru), etc.), metal-containing compositions (e.g., metal silicide, metal nitride, metal carbide, etc.), and/or conductively-doped semiconductor materials (e.g., conductively-doped silicon, conductively-doped germanium, etc.).

In some embodiments, the conductive structure 14 may comprise metal, and may be referred to as a metal-containing structure.

In some embodiments, the conductive structure 14 may comprise, consist essentially of, or consist of WSi, where the chemical formula indicates primary constituents rather than a specific stoichiometry. The WSi may be alternatively referred to as $WSi_x$, where x is a number greater than zero.

A stack 16 is formed over the conductive structure 14. The stack 16 comprises a first layer 18, a second layer 20, and a third layer 22. The first, second and third layers comprise first, second and third materials 24, 26 and 28, respectively.

In some embodiments, the first and third materials 24 and 28 may be electrically conductive. In such embodiments, the first and third materials may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the first and third materials may comprise conductively-doped semiconductor material. The semiconductor material may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). The first and third materials 24 and 28 may comprise a same composition as one another, or may comprise different compositions relative to one another. In some embodiments, the first and third materials 24 and 28 may comprise conductively-doped silicon. The conductively-doped silicon may be doped to a concentration of at least about $10^{22}$ atoms/cm$^3$, at least about $10^{24}$ atoms/cm$^3$, etc., with suitable conductivity-enhancing dopant (e.g., boron, phosphorus, arsenic, etc.). In some embodiments, the materials 24 and 28 may be n-type silicon doped to a suitable conductivity-enhancing concentration with phosphorus.

The second material 26 may be a sacrificial material, and specifically may be a material which can be selectively removed relative to the first and third materials 24 and 28. For purposes of interpreting this disclosure and the claims follow, a material is considered to be selectively removable relative to another material if the material may be etched faster than the other material.

In some embodiments, the second material 26 may comprise, consist essentially of, or consist of silicon dioxide, silicon nitride, etc. In some embodiments, the second layer 20 may comprise multiple materials, rather than comprising the illustrated single material. For instance, the second layer 20 may comprise a laminate of two or more stacked materials.

In some embodiments, the stack 16 may be referred to as a first stack to distinguish it from another stack formed at a later process stage. In some embodiments, the sacrificial material 26 may be referred to as a first sacrificial material to distinguish it from another sacrificial material formed at a later process stage.

Figure 6:
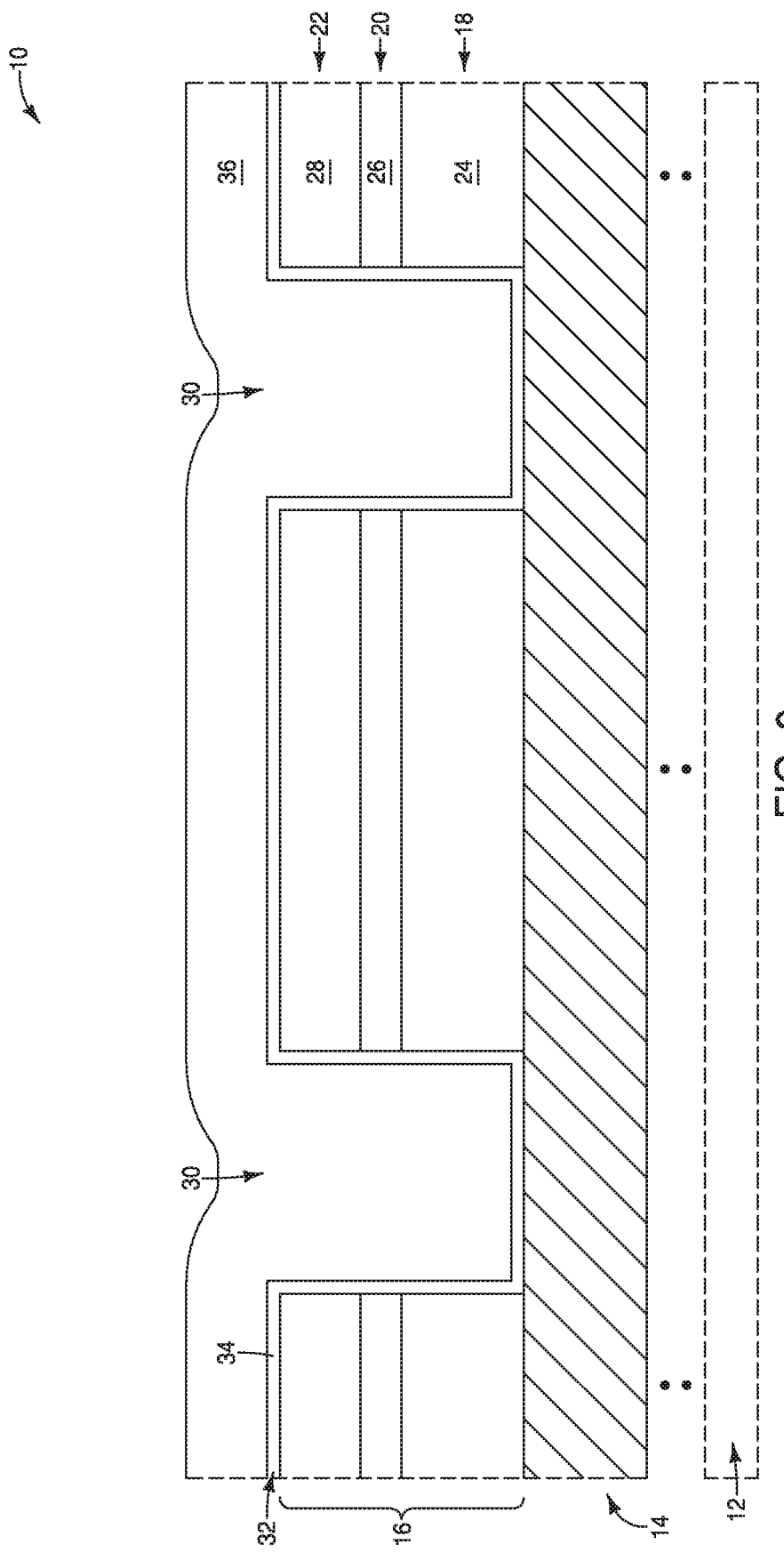

Referring to FIG. 6, openings 30 are formed to extend through the stack 16 to the conductive structure 14. In the illustrated embodiment, the openings 30 stop at an upper surface of the conductive structure 14. In other embodiments, the openings 30 may extend into the conductive structure 14. In some embodiments, the openings 30 may be referred to as first openings to distinguish them from other openings formed at subsequent process stages.

A liner 32 is formed to extend across an upper surface of the stack 16, and within the openings 30. The liner 32 comprises a liner material 34. The liner material may be alternatively referred to as a protective material. The material 34 may comprise any suitable composition(s); and in some embodiments may comprise, consist essentially of, or consist of silicon nitride, silicon, etc. To the extent that the liner material 34 consists essentially of silicon, such silicon may be relatively undoped; and may, for example, have a dopant concentration of less than or equal to about $10^{16}$ atoms/cm³, less than or equal to about $10^{15}$ atoms/cm³, etc. Accordingly, if the liner material 34 consists essentially of silicon, the amount of dopant (if any) present within the liner may be approximately an intrinsic concentration.

In some embodiments, the liner material 34 may be referred to as a protective first material to distinguish it from other protective materials formed at subsequent process stages.

A sacrificial material 36 is formed to extend across the stack 16 and within the lined openings 30. In some embodiments, the sacrificial material 36 may be referred to as a second material to distinguish it from the first material 34.

In some embodiments, the sacrificial materials 26 and 36 may be referred to as first and second sacrificial materials, respectively.

The material 36 may comprise any suitable composition(s) which is (are) selectively removable relative to the protective first material 34. In some embodiments, the protective first material 34 comprises silicon nitride, and the second material 36 comprises silicon dioxide and one or more of boron, phosphorus and fluorine (e.g., borophosphosilicate glass). In some embodiments, the protective first material 34 consists essentially of silicon, and the second material 36 comprises, consists essentially of, or consists of tungsten.

Figure 6A:
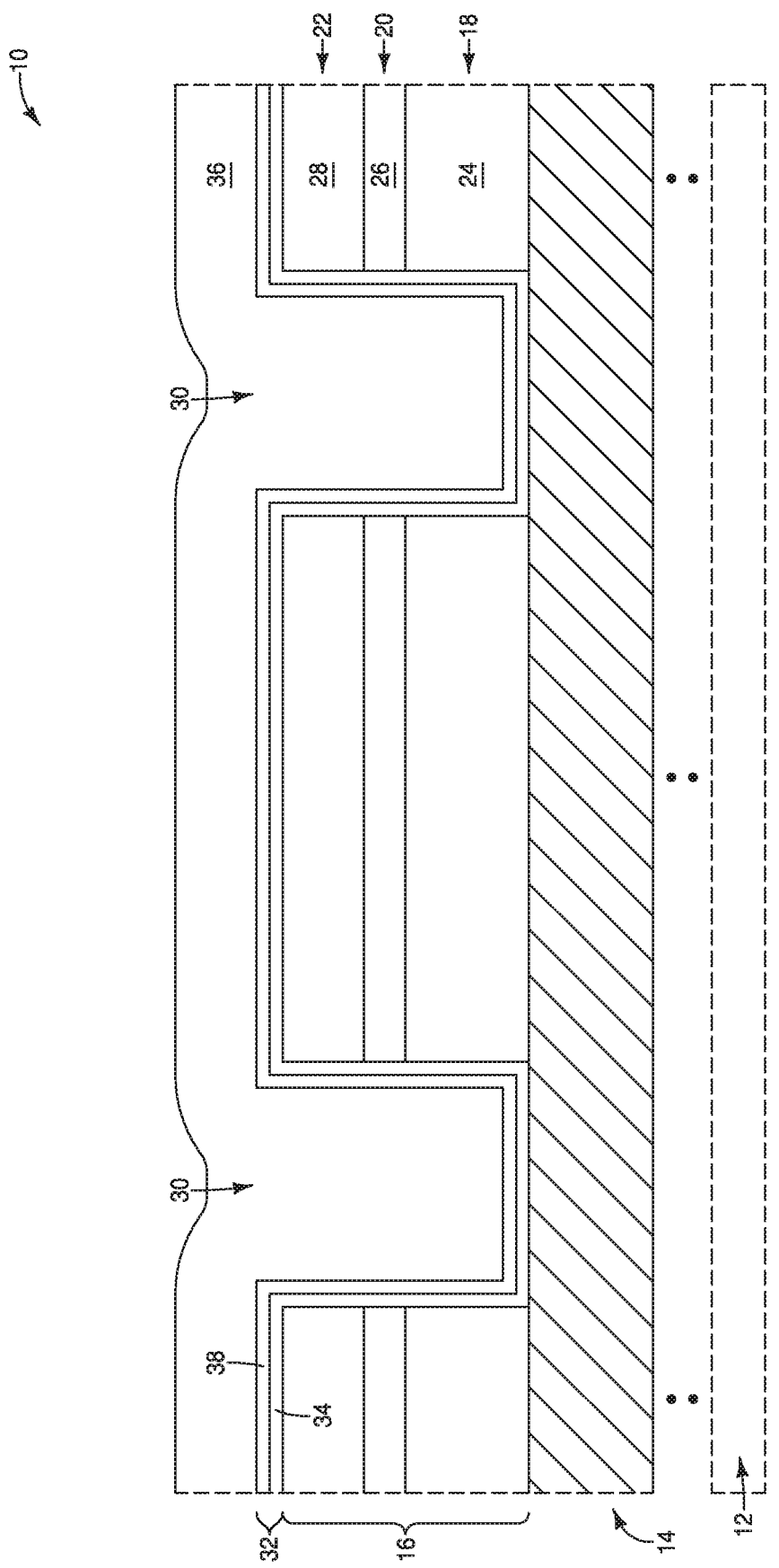

In some embodiments, the protective liner 32 may comprise multiple materials, rather than comprising the single material 34. For instance, FIG. 6A shows an embodiment in which the liner 32 comprises a second liner material 38 over the first material 34. In some embodiments, the first material 34 may be considered to be a region consisting essentially of silicon. In such embodiments, the second material 38 may comprise, consist essentially of, or consist of silicon dioxide, and the sacrificial material 36 may comprise, consist essentially of, or consist of tungsten. FIG. 6B shows another embodiment in which the liner 32 comprises multiple materials. In the embodiment of FIG. 6B, the liner 32 comprises the material 34 consisting essentially of silicon, the material 38 comprising silicon dioxide, and comprises another material 40 over the material 38. The material 40 may, for example, comprise, consist essentially of, or consist of metal nitride (e.g., titanium nitride). The sacrificial material 36 of FIG. 6B may comprise, consist essentially of, or consist of tungsten.

FIG. 7 shows a process stage subsequent to that of FIG. 6, and shows that planarization (e.g., chemical-mechanical polishing, CMP) has been utilized to remove the sacrificial material 36 and the liner material 34 from over an upper surface of the stack 16. The planarization forms a planarized surface 41 extending across the materials 28, 34 and 36. The surface 41 may or may not have the illustrated planar topography, and in some embodiments may have a divot (concavity) extending into the soft material 36.

Although the shown embodiment has the liner material 34 removed from over the stack 16 with the planarization process, in other embodiments the planarization process may stop at an upper surface of the liner 32 (FIG. 6) rather than removing the liner from over the stack 16.

Figure 8:
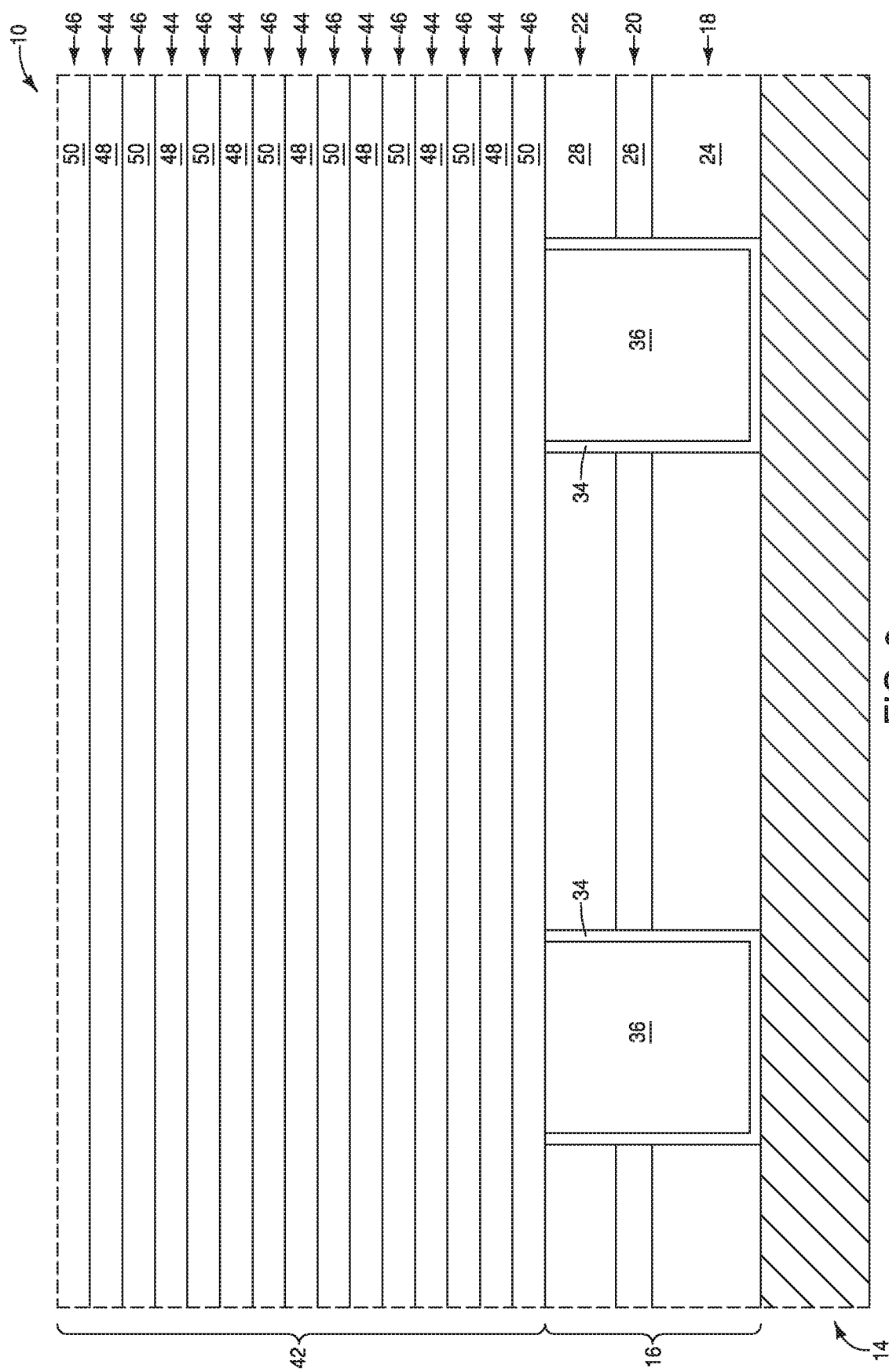

Referring to FIG. 8, a second stack 42 is formed over the first stack 16. The second stack 42 has alternating first and second levels 44 and 46. The first levels 44 comprise a material 48, and the second levels 46 comprises a material 50. The materials 48 and 50 may comprise any suitable compositions. In some embodiments, the material 48 may comprise, consist essentially of, or consist of silicon nitride; and the material 50 may comprise, consist essentially of, or consist of silicon dioxide. In some embodiments the materials 48 and 50 may be referred to as a third material and a fourth material, respectively, to distinguish them from the first and second materials 34 and 36 that had been formed within the openings 30 (FIG. 6).

The base 12 (FIG. 7) is not shown in FIG. 8 (and the drawings following FIG. 8) in order to simplify the drawings. It is to be understood, however, that the base would still be present.

Figure 9:
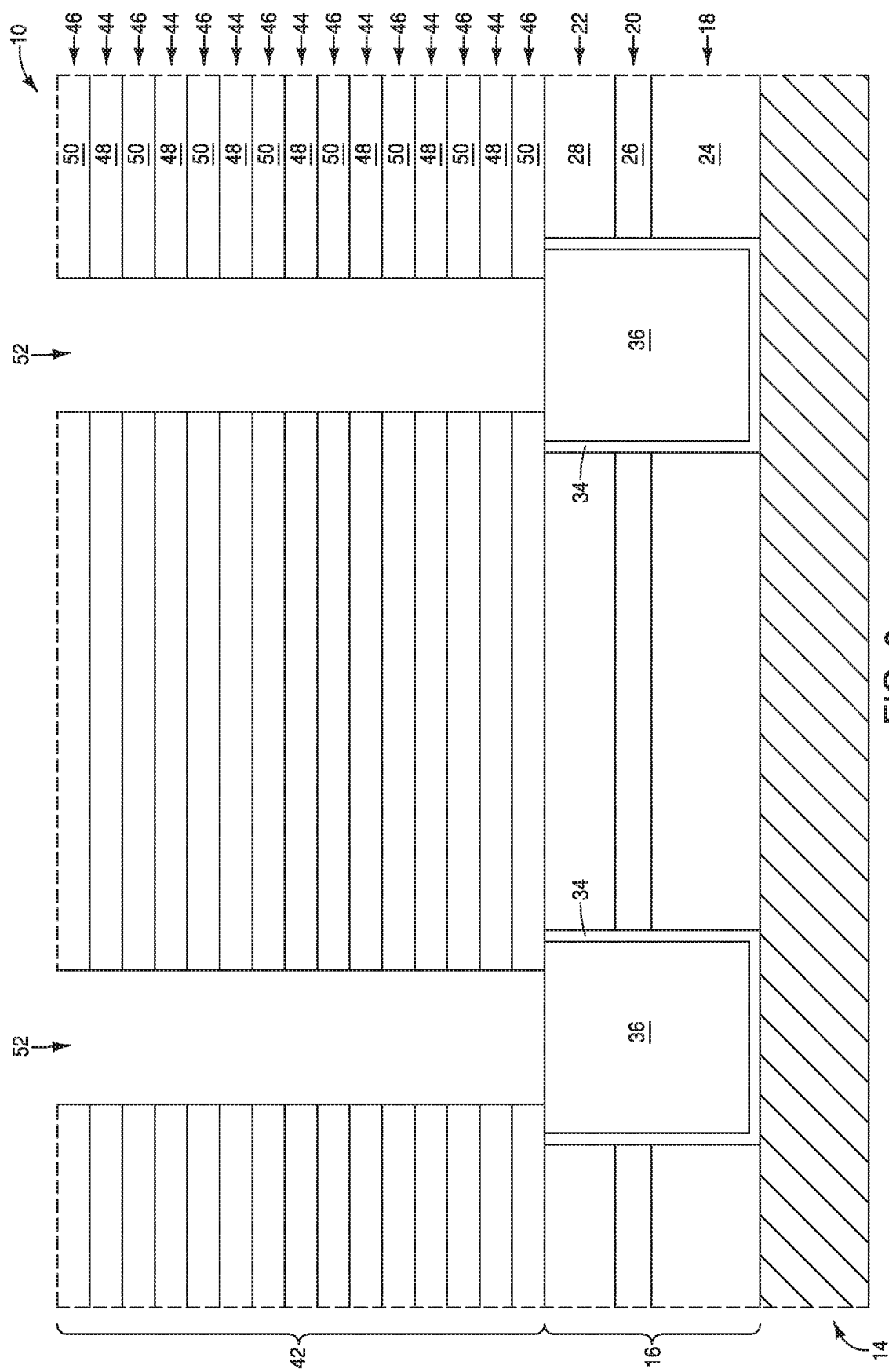

Referring to FIG. 9, openings 52 are formed to extend through the second stack 42 and to the sacrificial material 36. The openings 52 may be referred to as second openings to distinguish them from the first openings 30 of FIG. 6.

Figure 10:
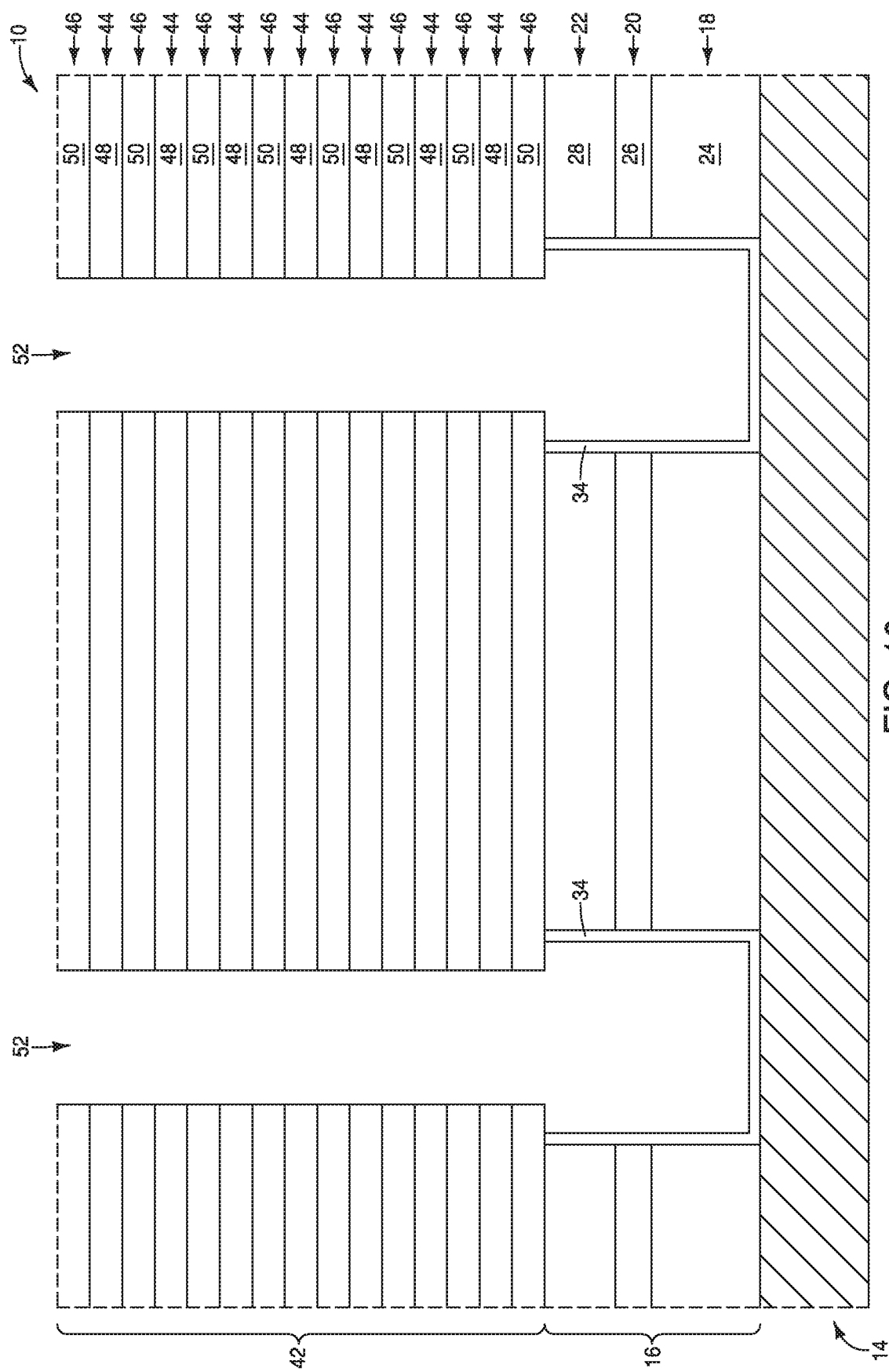

Referring to FIG. 10, the openings 52 are extended through the sacrificial material 36 (FIG. 9) and to the protective material 34.

Figure 11:
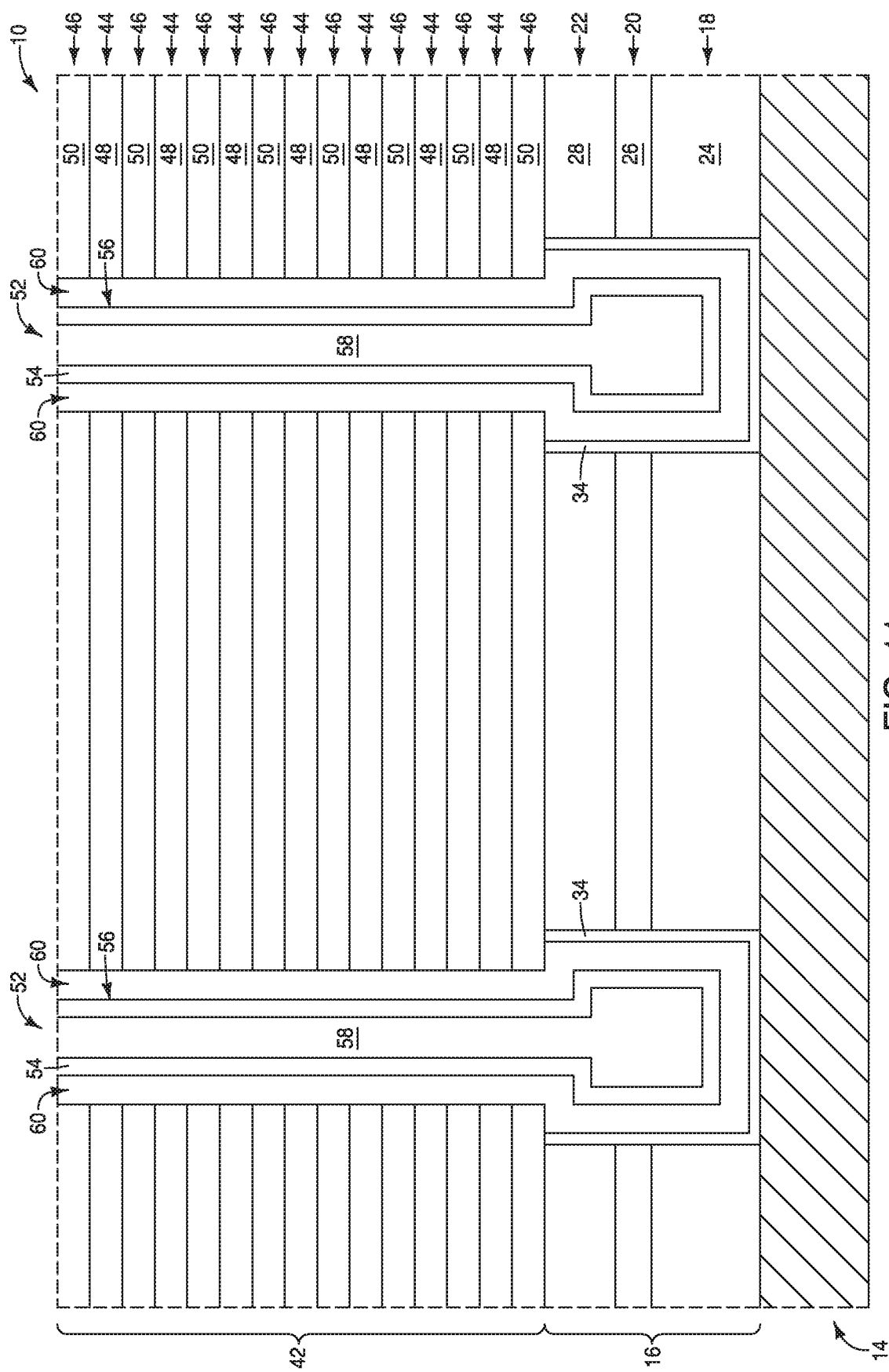

Referring to FIG. 11, semiconductor material (channel material) 54 is formed within the openings 52. The semiconductor material 54 may be referred to as first semiconductor material to distinguish it from other semiconductor materials formed at subsequent process stages. The first semiconductor material (channel material) 54 forms channel material pillars 56.

The semiconductor material 54 may comprise any suitable composition(s); and in some embodiments may comprise, consist essentially of, or consist of one or more of silicon, germanium, III/V semiconductor material (e.g., gallium phosphide), semiconductor oxide, etc. In some embodiments, the semiconductor material 54 may comprise, consist essentially of, or consist of appropriately-doped silicon.

In the illustrated embodiment, the channel material pillars 56 are annular rings (as shown in a top-down view of FIG. 20A), with such annular rings surrounding an insulative material 58. Such configuration of the channel material pillars may be considered to correspond to a "hollow" channel configuration, with the dielectric material 58 being provided within the hollows of the channel material pillars. In other embodiments, the channel material may be configured as solid pillars, rather than being configured as the illustrated hollow pillars.

The channel material pillars 56 are spaced from the materials 48 and 50 of the stack 42 by intervening regions 60. The regions 60 comprise one or more cell materials (memory cell materials), with such cell materials being formed within the openings 52 prior to the channel material 54. The cell materials of the regions 60 may comprise tunneling material, charge-storage material, charge-blocking material and dielectric-barrier material. The tunneling material (also referred to as gate dielectric material) may comprise any suitable composition(s); and in some embodiments may comprise one or more of silicon dioxide, aluminum oxide, hafnium oxide, zirconium oxide, etc. The charge-storage material may comprise any suitable composition(s); and in some embodiments may comprise floating gate material (e.g., polysilicon) or charge-trapping material (e.g., one or more of silicon nitride, silicon oxynitride, conductive nanodots, etc.). The charge-blocking material may comprise any suitable composition(s); and in some embodiments may comprise one or more of silicon dioxide, aluminum oxide, hafnium oxide, zirconium oxide, etc. The dielectric-barrier material may comprise any suitable composition(s); and in some embodiment may comprise one or more of aluminum oxide, hafnium oxide, zirconium oxide, etc.

Figure 12:
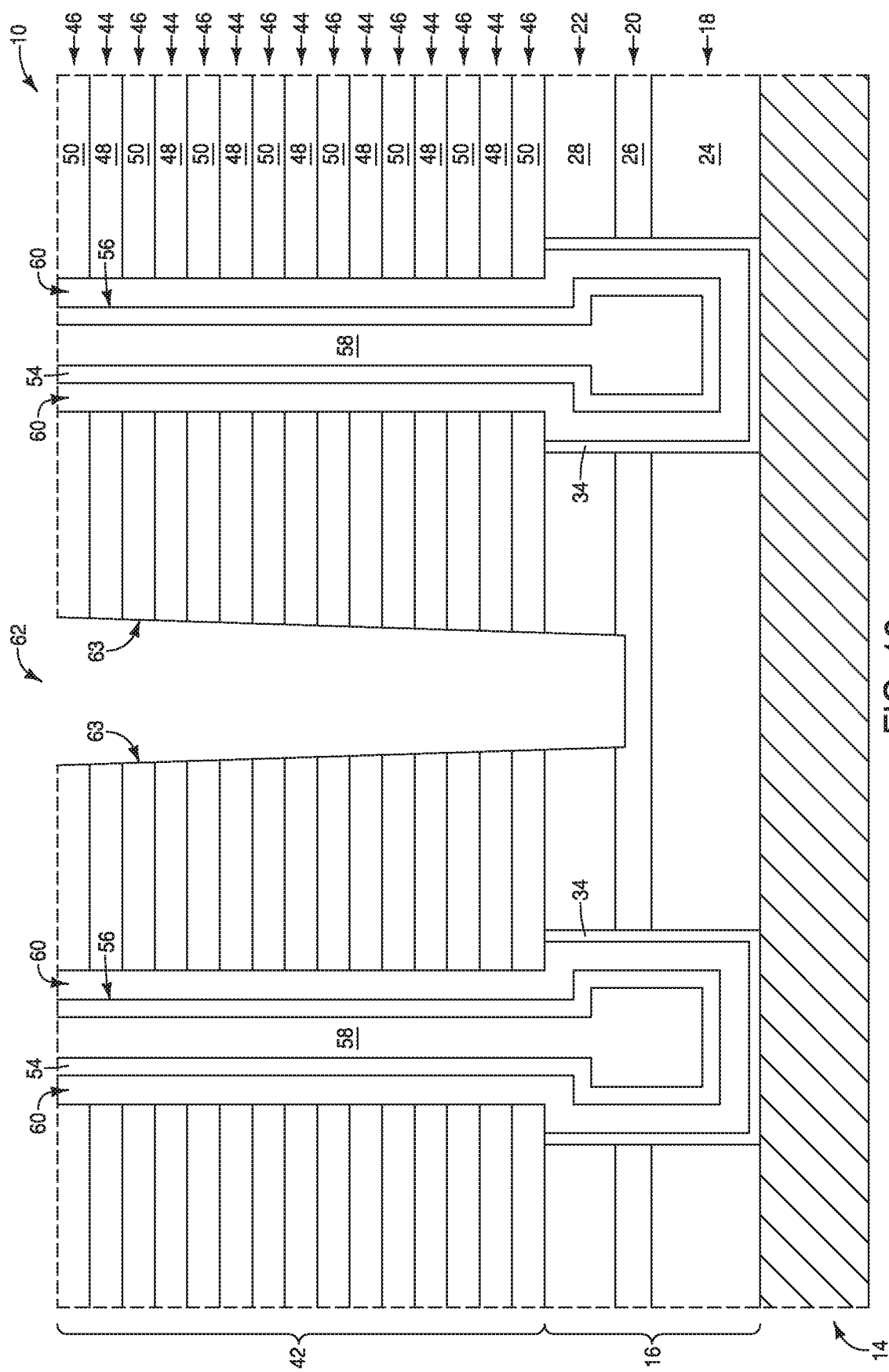

Referring to FIG. 12, an opening 62 is formed to pass through the second stack 42, through the third layer 22, and to the second layer 26. The opening 52 may or may not penetrate the second layer 26. The opening 62 may be referred to as a third opening to distinguish it from the first openings 30 of FIG. 6 and the second openings 52 of FIG. 9. In some embodiments, the openings 52 are cylindrical openings (as may be understood with reference to the top-down view of FIG. 20A), and the opening 62 is a trench which extends in and out of the page relative to the cross-section of FIG. 12 (as may also be understood with reference to the top-down view of FIG. 20A).

The opening 62 has sidewall surfaces 63 which extend along the materials 48 and 50 of the stack 42. In the shown embodiment, the sidewall surfaces 63 are tapered. In other embodiments, the sidewall surfaces 63 may be substantially vertically straight; with the term "substantially vertically straight" meaning vertically straight to within reasonable tolerances of fabrication and measurement.

Figure 13:
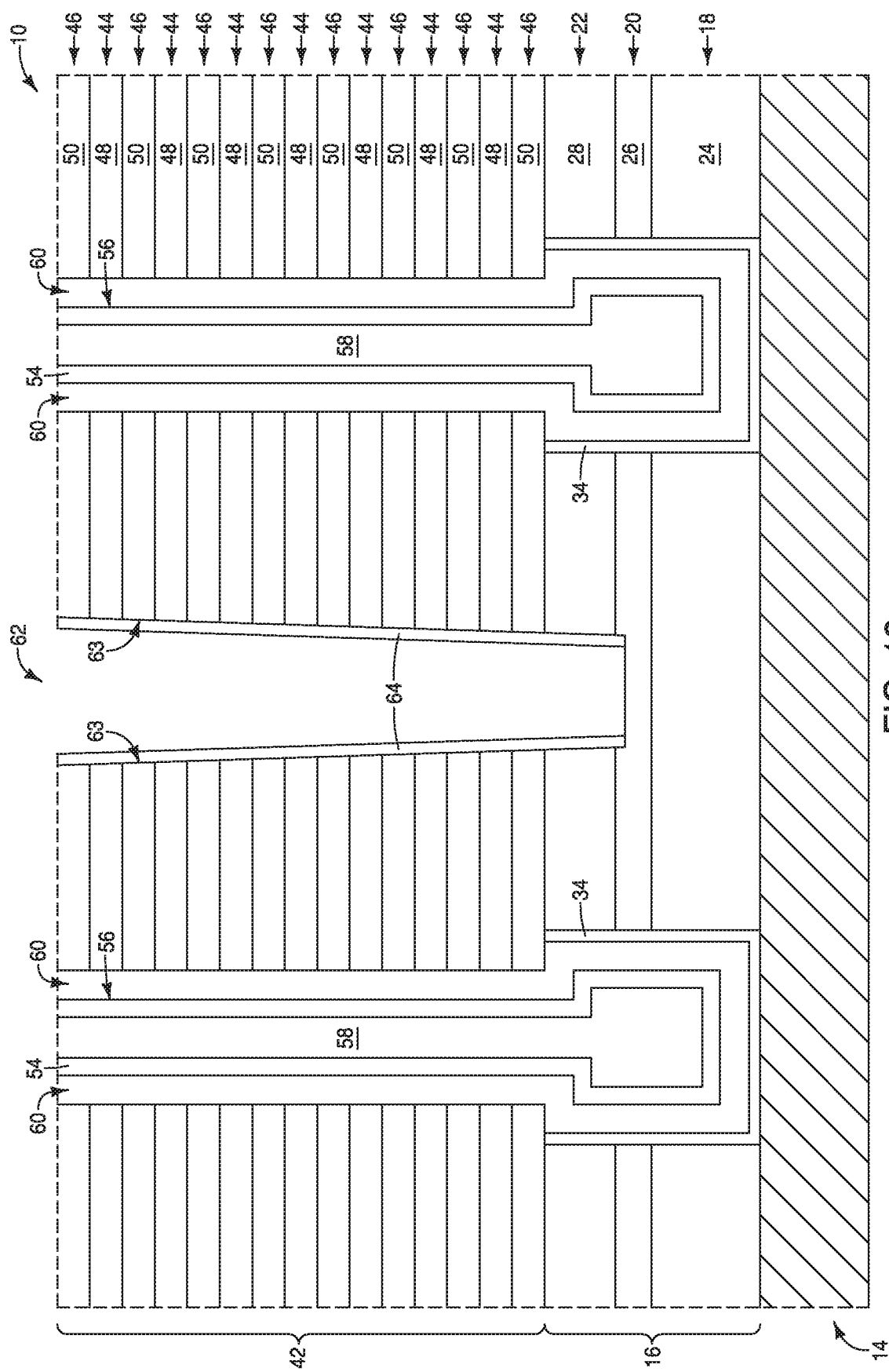

Referring to FIG. 13, protective material 64 is formed along the sidewall surfaces 63 of the opening 62. In some embodiments, the protective material 64 may be considered to line the sidewall surfaces 63. In some embodiments, the protective material 64 may be referred to as a second protective material to distinguish it from the first protective material 34. In some embodiments, the protective material 64 may be referred to as a fifth material to distinguish it from the first, second, third and fourth materials 34, 36, 48 and 50.

The protective material 64 may comprise any suitable composition(s). In some embodiments, the protective material 64 may comprise, consist essentially of, or consist of silicon; and specifically may comprise silicon which is effectively undoped (e.g., comprising an intrinsic dopant concentration, and in some embodiments comprising a dopant concentration of less than or equal to about $10^{16}$ atoms/$cm^3$).

Figure 14:
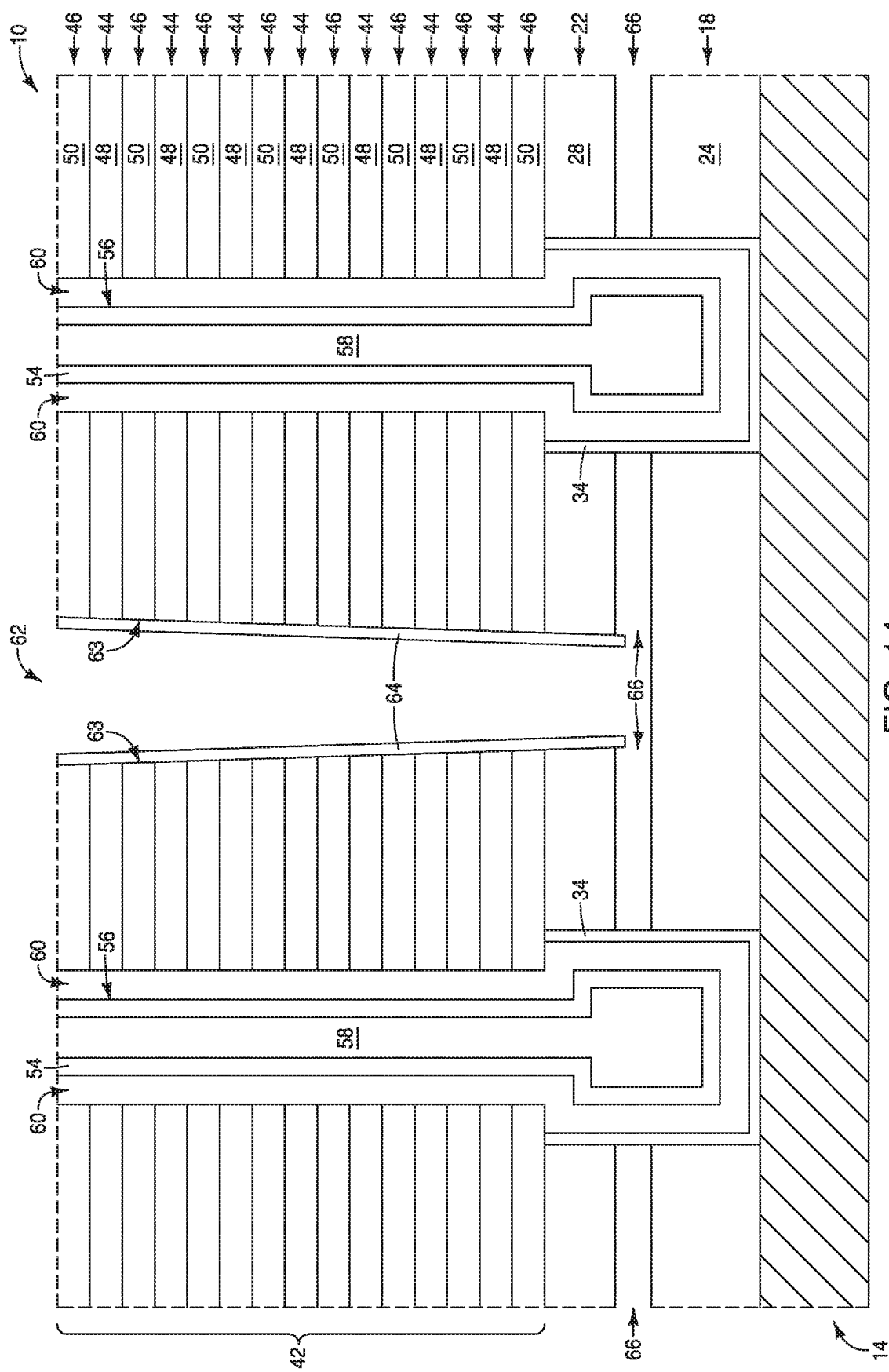

Referring to FIG. 14, the sacrificial material 26 of the second layer 20 (FIG. 13) is selectively removed relative to the materials 24 and 28 of the first and third layers 18 and 22, and relative to the protective material 64. Such forms conduits 66 between the first and third layers 18 and 22.

Figure 15:
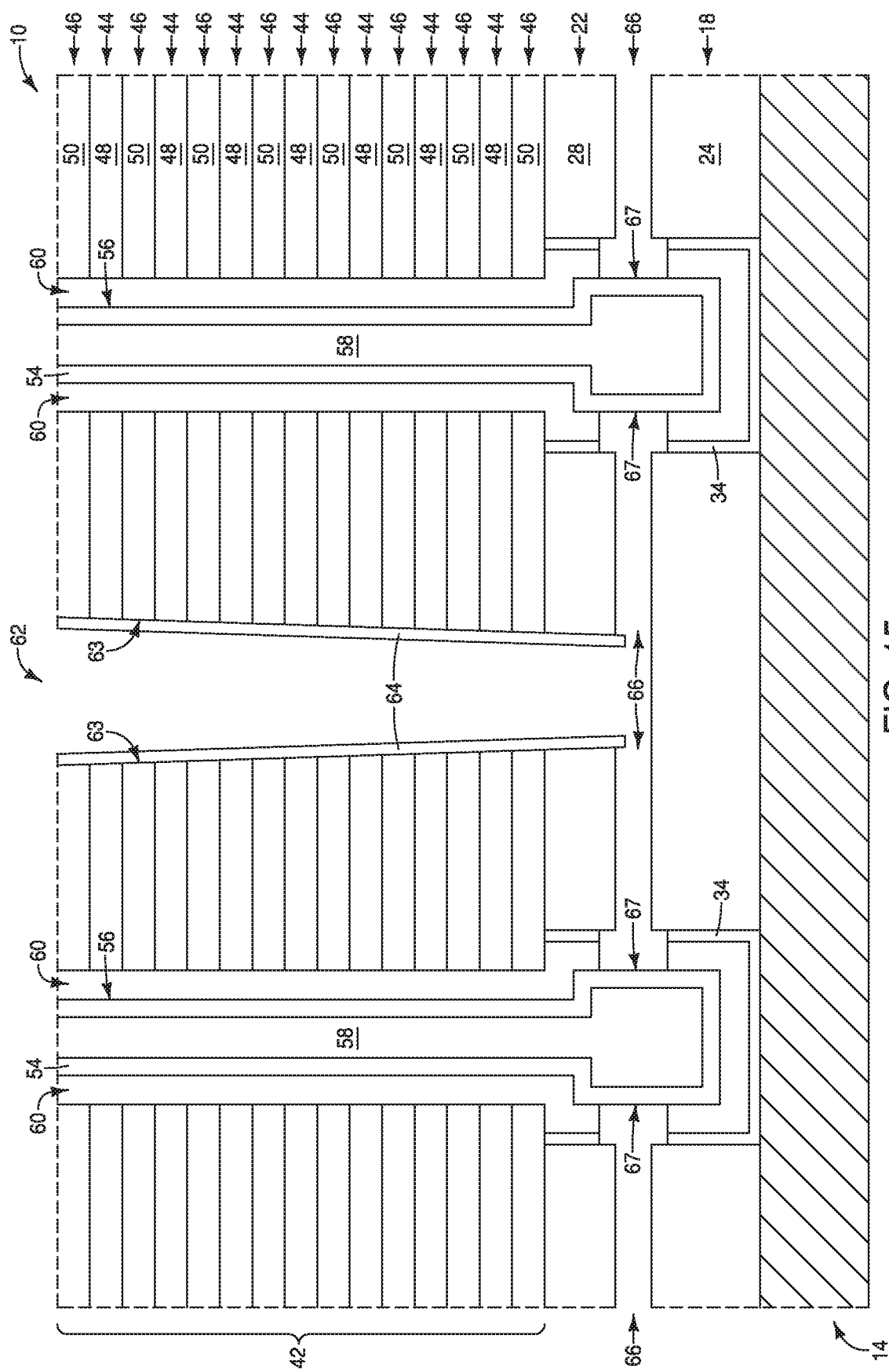

Referring to FIG. 15, the conduits 66 are extended through the protective material 34 and the cell materials within the regions 60 to expose sidewall surfaces 67 of the semiconductor material (channel material) 54.

Figure 16:
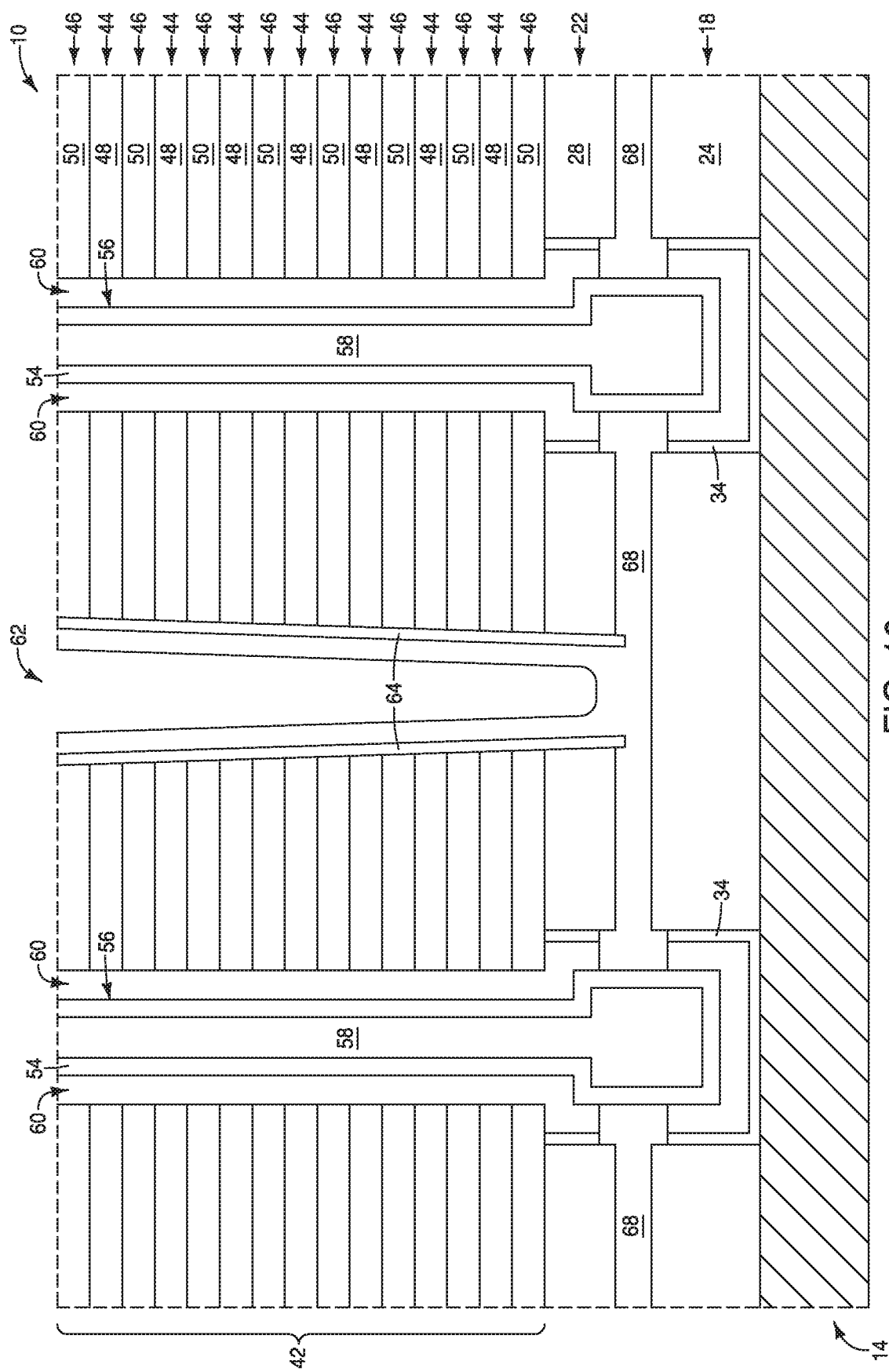

Referring to FIG. 16, conductively-doped semiconductor material 68 is formed within the conduits 66 (FIG. 15). The semiconductor material 68 may be referred to as a second semiconductor material to distinguish it from the first semiconductor material 54.

The semiconductor material 68 may comprise any suitable composition(s); and in some embodiments may comprise, consist essentially of, or consist of one or more of silicon, germanium, III/V semiconductor material (e.g., gallium phosphide), semiconductor oxide, etc. In some embodiments, the semiconductor material 68 may comprise silicon which is heavily doped (e.g., doped to a concentration of at least about $10^{22}$ atoms/$cm^3$) with n-type dopant (e.g., phosphorus). The semiconductor material 68 may comprise a same composition as one or both of the conductive materials 24 and 28 in some embodiments, and in other embodiments may comprise a different composition than both of the conductive materials 24 and 28.

Figure 17:
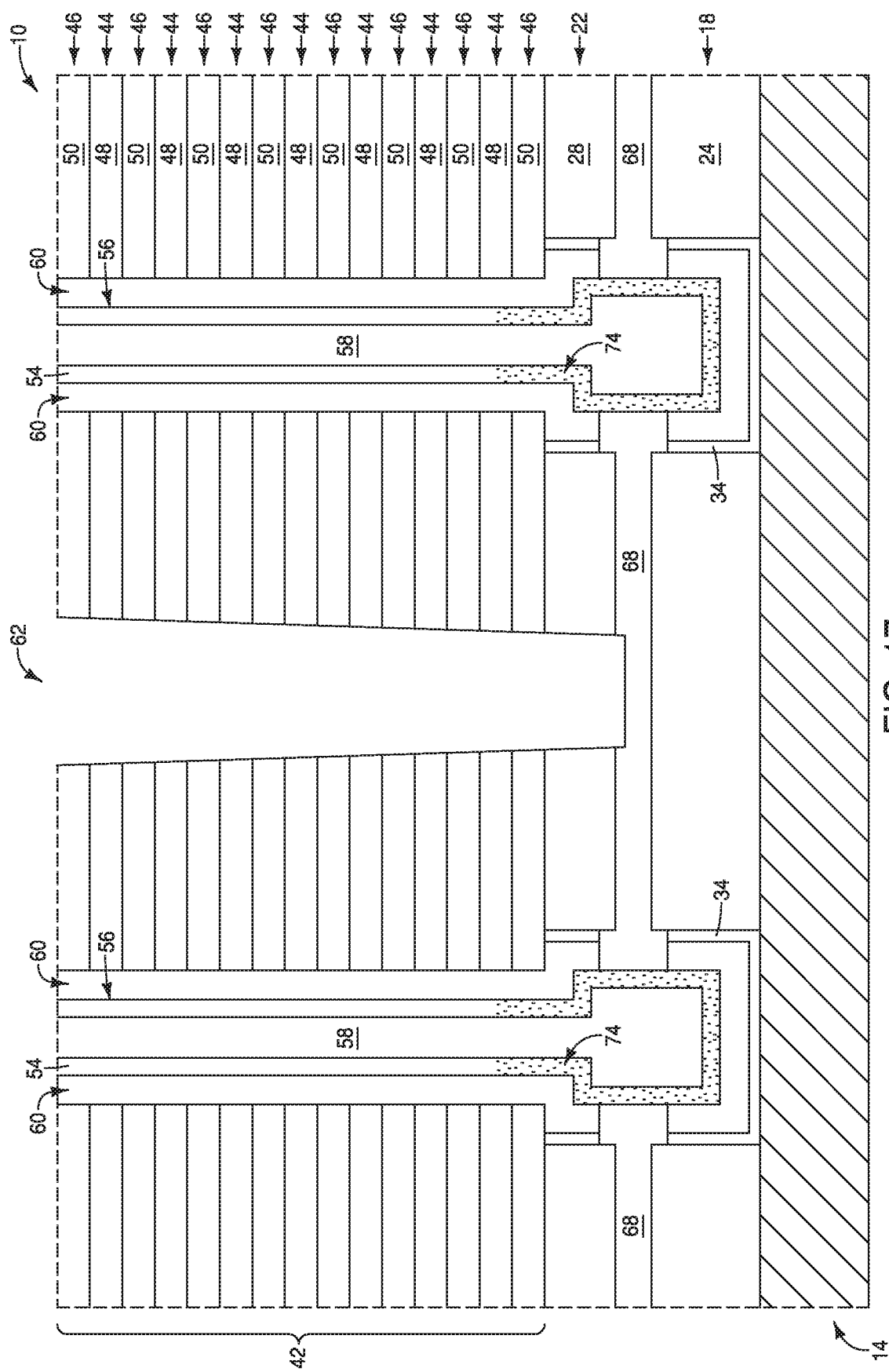

Referring to FIG. 17, the materials 64 and 68 are removed from within the opening (slit) 62. The materials 64 and 68 may be removed to any suitable level within the slit 62. In the illustrated embodiment, the materials 64 and 68 are entirely removed from within the slit, but it is to be understood that in other embodiments one or both of the materials 64 and 62 may remain within a portion of the slit 62.

Additionally, dopant is out-diffused from the conductively-doped semiconductor material 68 into the semiconductor material (channel material) 54 to form a heavily-doped region 74 within a lower portion of the semiconductor material 54. Stippling is utilized to indicate dopant within the heavily-doped region 74.

The out-diffusion from the doped material 68 into the semiconductor material 54 may be accomplished with any suitable processing, including, for example, suitable thermal processing (e.g., thermal processing at a temperature exceeding about 300° C. for a duration of at least about two minutes).

Figure 18:
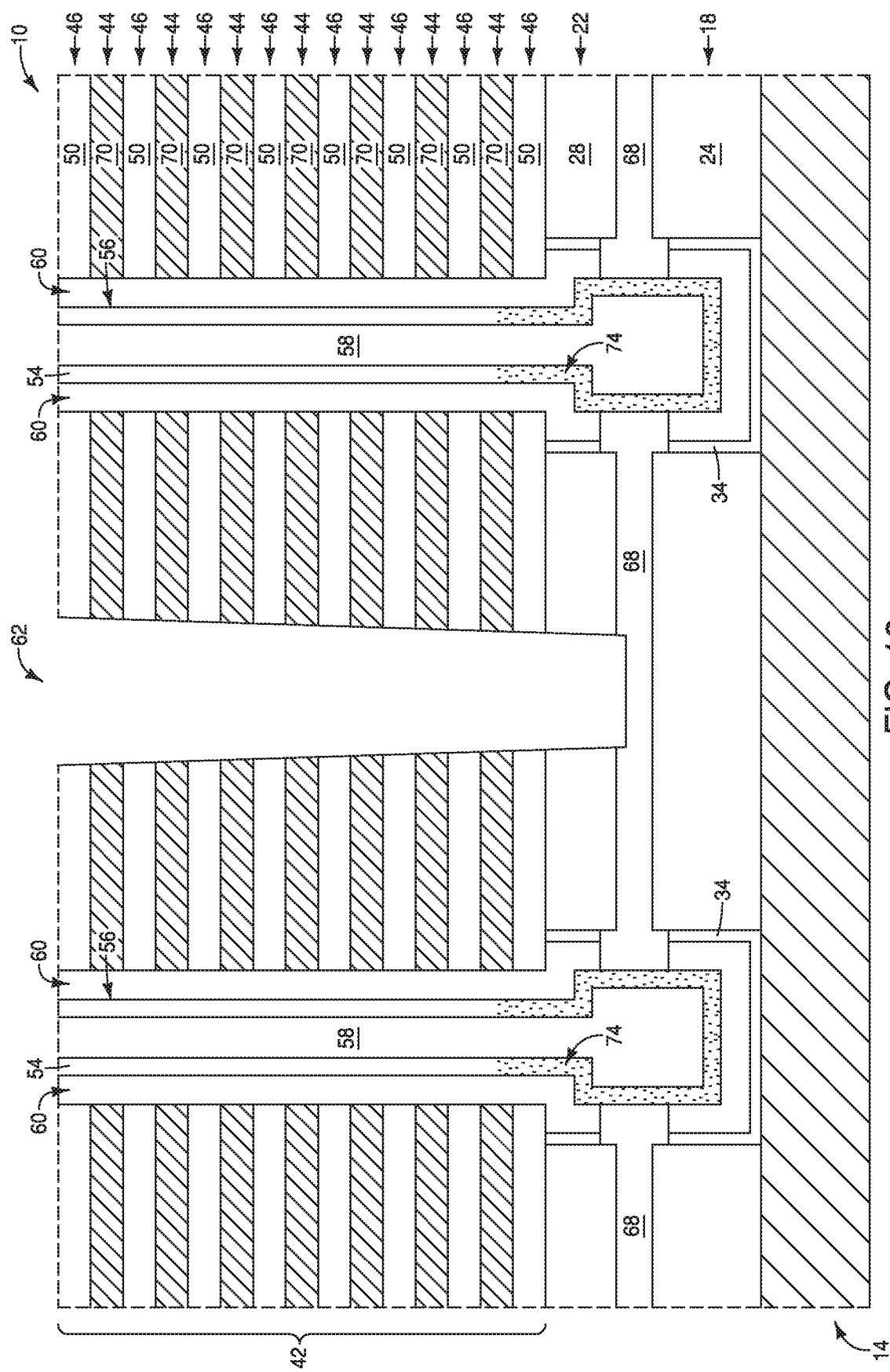

Referring to FIG. 18, the material 48 (FIG. 16) of the first levels 44 is removed and replaced with conductive material 70. Although the conductive material 70 is shown to entirely fill the first levels 44, in other embodiments at least some of the material provided within the first levels 44 may be insulative material (e.g., dielectric-blocking material). The conductive material 70 may comprise any suitable composition(s); and in some embodiments may comprise a tungsten core at least partially surrounded by titanium nitride.

The first levels 44 of FIG. 18 are conductive levels, and the stack 42 may be considered to comprise alternating insulative levels 46 and conductive levels 44.

Figure 19:
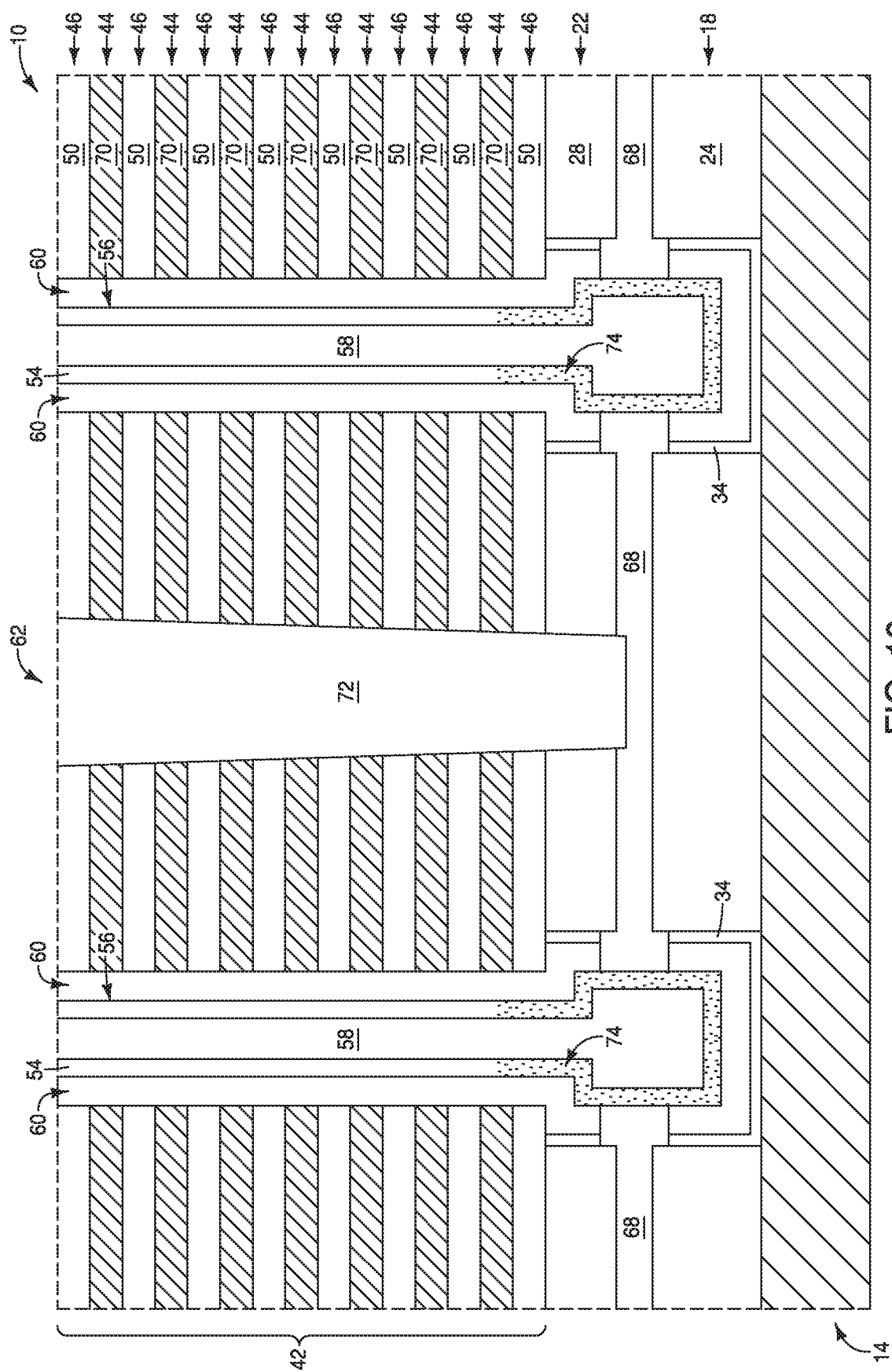

Referring to FIG. 19, insulative material 72 is formed within the slit 62. The insulative material 72 may comprise any suitable composition(s); and in some embodiments may comprise, consist essentially of, or consist of silicon dioxide.

Figure 20:
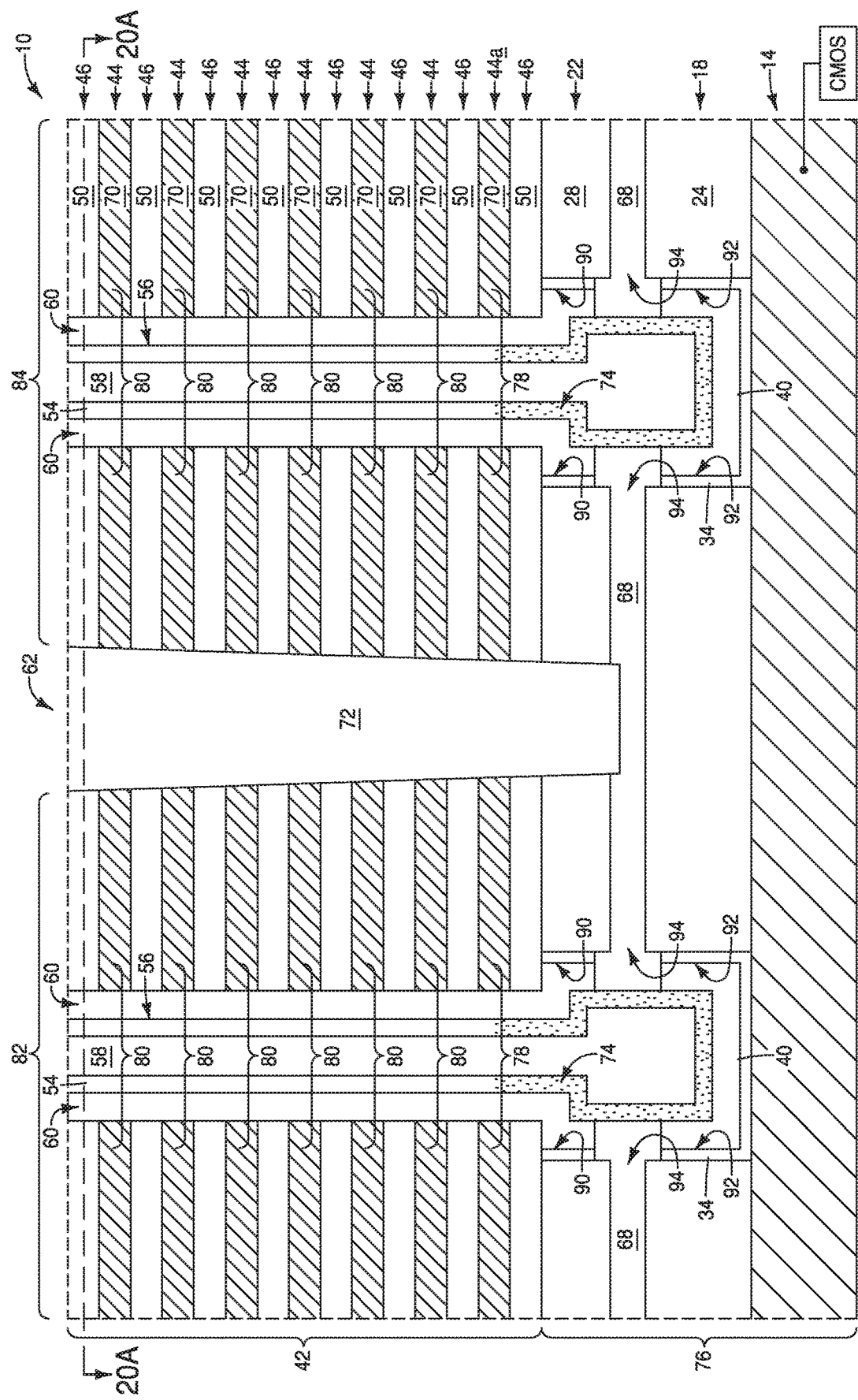

Referring to FIG. 20, the assembly 10 is shown as a memory device comprising memory cells 80 and select devices (SGS devices) 78. A lowermost of the conductive levels 44 is labeled 44a, and the doped region 74 extends to the conductive level 44a. The conductive level 44a comprises the SGS devices 78. In the shown embodiment, the dopant extends partially across the level 44a to achieve the desired balance between non-leaky "OFF" characteristics for the SGS devices and leaky GIDL characteristics for the SGS devices. Although only one of the conductive levels is shown to be incorporated into the source-select devices, in other embodiments multiple conductive levels may be incorporated into the source-select devices. The conductive levels may be electrically coupled with one another (ganged together) to be together incorporated into long-channel source-select devices. If multiple of the conductive levels are incorporated into the source-select devices, the out-diffused dopant may extend upwardly across two or more of the conductive levels 44 which are incorporated into the source-select devices.

The memory cells 80 (e.g., NAND memory cells) are vertically stacked one atop another. The memory cells 80 are along the first levels 44. Each of the memory cells comprises a region of the semiconductor material (channel material) 54, and comprises regions (control gate regions) of the conductive levels 44. The regions of the conductive levels which are not comprised by the memory cells 80 may be considered to be wordline regions (or routing regions) which couple the control gate regions with driver circuitry and/or with other suitable circuitry. The memory cells 80 also comprise the cell materials (e.g., the tunneling material, charge-storage material, dielectric-barrier material and charge-blocking material) within the regions 60.

In some embodiments, the conductive levels 44 associated with the memory cells 80 may be referred to as wordline/control gate levels (or memory cell levels), in that they include wordlines and control gates associated with vertically-stacked memory cells of NAND strings. The NAND strings may comprise any suitable number of memory cell levels. For instance, the NAND strings may have 8 memory cell levels, 16 memory cell levels, 32 memory cell levels, 64 memory cell levels, 512 memory cell levels, 1024 memory cell levels, etc.

The conductive materials 14, 24, 68 and 28 together form a source structure 76 of a memory device. The source structure may be analogous to the source structures 216 described in the "Background" section. The source structure is shown to be coupled with control circuitry (e.g., CMOS). The control circuitry may be under the source structure 76 (e.g., may be associated with the base 12 of FIG. 5, and in a location directly under the source structure 76) or may be in any other suitable location. The conductive material 14 may be coupled with the control circuitry (e.g. CMOS) at any suitable process stage.

Figure 20A:
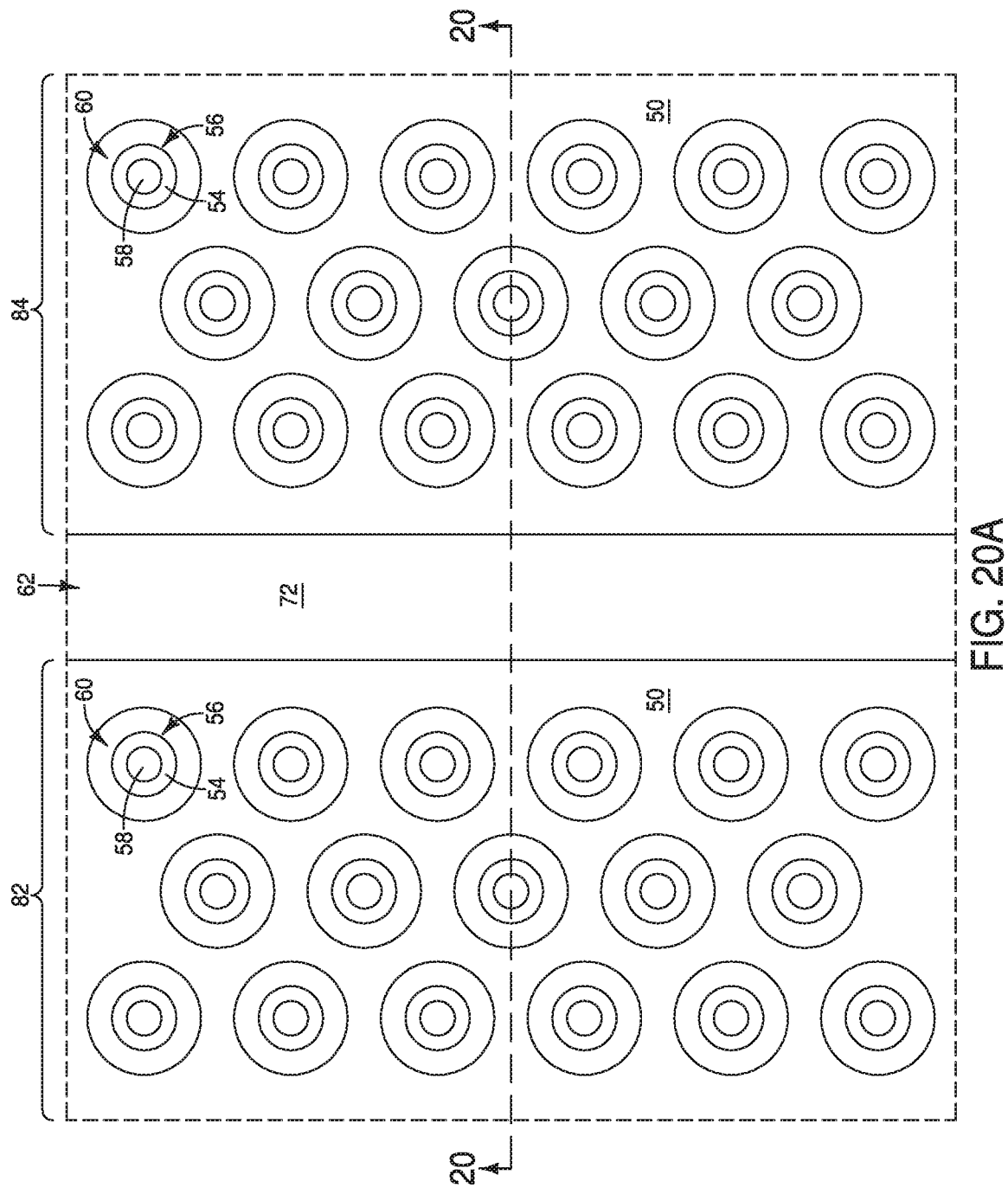
FIG. 20A is a diagrammatic top-down view along the line 20A-20A of FIG. 20. The cross-sectional side view of FIG. 20 is along the line 20-20 of FIG. 20A.

In some embodiments, the channel material pillars 56 may be considered to be representative of a large number of substantially identical channel material pillars extending across the memory device 10; with the term "substantially identical" meaning identical to within reasonable tolerances of fabrication and measurement. The top-down view of FIG. 20A shows the pillars 56 arranged within a matrix (with the pillars 56 being hexagonally-packed in the illustrated embodiment), and shows the slit 62 extending through the matrix of the channel material pillars. In some embodiments, the slit 62 may divide the pillars between a first block region 82 and a second block region 84. Accordingly, the memory cells 80 on one side of the slit 62 may be considered to be within the first block region 82, and the memory cells 80 on the other side of the slit 62 may be considered to be within a second block region 84. The block regions 82 and 84 may be analogous to the blocks (or sub-blocks) described above in the "Background" section of this disclosure.

In some embodiments, the region of the channel material 54 beneath the SGS layer 44a by be considered to be a lower region of the channel material. The liner material 34 along the lower region of the channel material may be considered to be configured as a first liner region 90 along the conductively-doped semiconductor material (e.g., silicon) 28 of an upper portion 22 of semiconductor material of the source structure 76, and as a second liner region 92 along the conductively-doped semiconductor material (e.g., silicon) 24 of a lower portion 18 of the semiconductor material of the source structure 76. The first and second liner regions 90 and 92 are vertically spaced from one another by intervening gaps 94. The liner regions 90 and 92 are along the cell materials (memory cell materials) within the regions 60.

Figure 21:
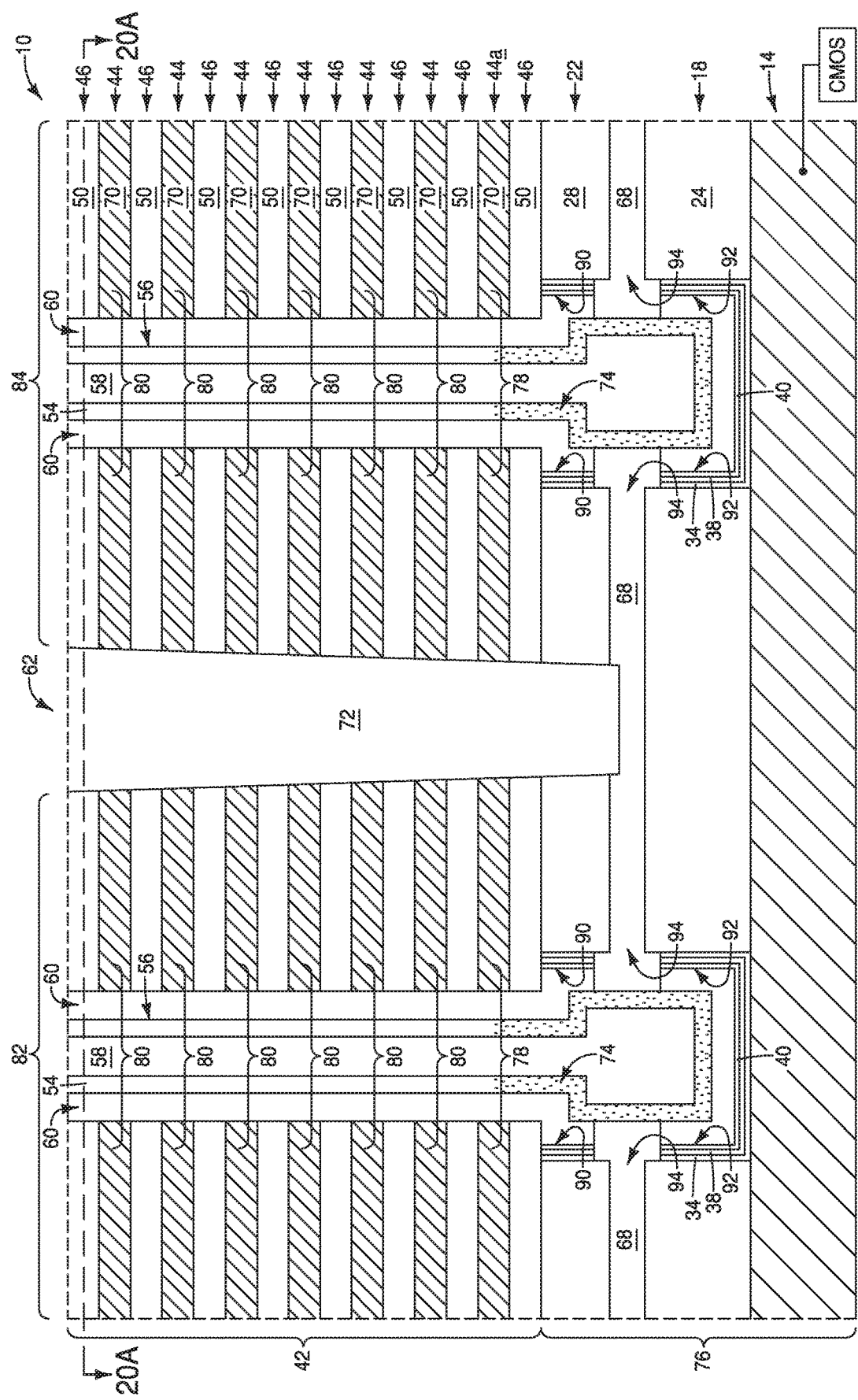
FIG. 21 is a diagrammatic cross-sectional side view of another example memory device.

FIG. 21 shows a memory device 10 similar to that of FIG. 20, but the liner regions 90 and 92 comprise the three layers (34, 38 and 40) described above with reference to FIG. 6B. Such three layers may be considered together to form a laminate configuration in some embodiments. The top-down view of FIG. 20A remains the same along the line 20A-20A of FIG. 21 as along the line 20A-20A of FIG. 20.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming an integrated assembly. A first stack is formed over a conductive structure. The first stack includes a first layer, a second layer over the first layer, and a third layer over the second layer. The first and third layers are electrically conductive. The second layer comprises a first sacrificial material. A first opening is formed to extend through the first stack. A second sacrificial material is formed within the first opening. A second stack is formed over the first stack. The second stack has alternating first and second levels. A second opening is formed to pass through the second stack and to the second sacrificial material. The second opening is extended through the second sacrificial material. First semiconductor material is formed within the extended second opening. A third opening is formed to pass through the second stack, through the third layer, and to the second layer. The first sacrificial material of the second layer is removed to form a conduit. Conductively-doped second semiconductor material is formed within the conduit. Dopant is out-diffused from the conductively-doped second semiconductor material into the first semiconductor material. The out-diffused dopant extends upwardly to at least one of the first levels. Conductive material is formed within the first levels. Insulative material is formed within the third opening.

Some embodiments include a method of forming an integrated assembly. A first stack is formed over a metal-containing structure. The first stack comprises a first layer, a second layer over the first layer, and a third layer over the second layer. A first opening is formed to extend through the first stack. The first opening is lined with a protective first material. The lined first opening is filled with a second material. After the filling of the lined first opening, a second stack is formed over the first stack. The second stack has alternating first and second levels. The first levels comprise third material, and the second levels comprise fourth material. The fourth material is insulative. A second opening is formed to pass through the second stack and to the second material within the first opening. The second opening is extended through the second material and to the protective first material. Channel material is formed within the extended second opening. A third opening is formed to pass through the second stack, through the third layer, and to the second layer. Sidewall surfaces of the third opening are lined with protective fifth material. The second layer is selectively removed relative to the first and third layers, and is selectively removed relative to the protective fifth material. The removal of the second layer forms a conduit. Conductively-doped semiconductor material is formed within the conduit. Dopant is out-diffused from the conductively-doped semiconductor material into the channel material. The out-diffused dopant migrates upwardly to at least a lowermost first level of the second stack. At least some of the third material is replaced with conductive material to form the first levels into conductive levels.

Some embodiments include a method of forming an integrated assembly. A first stack is formed over a metal-containing structure. The first stack comprises a first layer, a second layer over the first layer, and a third layer over the second layer. The first and third layers comprise conductively-doped silicon. The second layer comprises silicon dioxide. A first opening is formed to extend through the first stack. A liner is formed within the first opening to line the first opening. Tungsten is formed within the lined first opening. A second stack is formed over the first stack. The second stack has alternating first and second levels. A second opening is formed to pass through the second stack and to the tungsten. The second opening is extended through the tungsten. First semiconductor material is formed within the extended second opening. A third opening is formed to pass through the second stack, through the third layer, and to the second layer. Sidewall surfaces of the third opening are lined with protective material. The silicon dioxide of the second layer is removed to form a conduit. Conductively-doped second semiconductor material is formed within the conduit. Dopant is out-diffused from the conductively-doped second semiconductor material into the first semiconductor material. The out-diffused dopant extends upwardly to at least one of the first levels. Conductive material is formed within the first levels. Insulative material is formed within the third opening.

Some embodiments include an integrated structure comprising a source structure comprising conductively-doped semiconductor material. Vertically-stacked conductive levels over the source structure. Upper conductive levels of the vertically-stacked conductive levels being memory cell levels, and a lower conductive level of the vertically-stacked conductive levels being a select device level. Channel material extending vertically along the memory cell levels and the select device level. A region of the channel material under the select device level being a lower region of the channel material. One or more memory cell materials being between the channel material and the vertically-stacked conductive levels. The one or more memory cell materials being along said lower region of the channel material. A first liner region being between the memory cell materials and the conductively-doped semiconductor material of an upper portion of the semiconductor material of the source structure. A second liner region being between the memory cell materials and the conductively-doped semiconductor material of a lower portion of the semiconductor material of the source structure. A gap being between the first and second liner regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming an integrated assembly, comprising:
    forming a first stack over a conductive structure; the first stack comprising a first layer, a second layer over the first layer, and a third layer over the second layer; the first and third layers being electrically conductive; the second layer comprising a first sacrificial material;
    forming a first opening to extend through the first stack;
    forming a second sacrificial material within the first opening and over the first stack;
    removing the second sacrificial material from over the first stack;
    after removing the second sacrificial material from over the first stack, forming a second stack over the first stack; the second stack having alternating first and second levels;
    forming a second opening to pass through the second stack and to the second sacrificial material;
    extending the second opening through the second sacrificial material;
    forming first semiconductor material within the extended second opening;
    forming a third opening to pass through the second stack, through the third layer, and to the second layer;
    removing the first sacrificial material of the second layer to form a conduit;
    forming conductively-doped second semiconductor material within the conduit;
    out-diffusing dopant from the conductively-doped second semiconductor material into the first semiconductor material, the out-diffused dopant extending upwardly to at least one of the first levels;
    forming conductive material within the first levels; and
    forming insulative material within the third opening.

2. The method of claim 1 comprising forming memory cells along the first levels, with the memory cells comprising regions of the first semiconductor material; wherein the integrated assembly includes a memory device which comprises the memory cells; and wherein the conductive structure, the first layer, the third layer and the conductively-doped second semiconductor material together form a source structure of the memory device.

3. The method of claim 2 further comprising forming a source-select device to comprise said at least one of the first levels.

4. The method of claim 1 wherein the second sacrificial material comprises silicon dioxide and one or more of phosphorus, fluorine and boron.

5. The method of claim 1 wherein the second sacrificial material comprises borophosphosilicate glass.

6. The method of claim 1 wherein the second sacrificial material comprises tungsten.

7. The method of claim 1 wherein the first and third layers comprise doped semiconductor material.

8. The method of claim 1 wherein the first and third layers comprise doped silicon.

9. The method of claim 8 wherein the first sacrificial material comprises silicon dioxide.

10. The method of claim 9 further comprising lining sidewall surfaces of the third opening with protective material prior to removing the first sacrificial material; and wherein the protective material consists essentially of silicon.

11. The method of claim 1 wherein the third opening extends into the second layer.

12. A method of forming an integrated assembly, comprising:
    forming a first stack over a metal-containing structure; the first stack comprising a first layer, a second layer over the first layer, and a third layer over the second layer;
    forming a first opening to extend through the first stack;
    lining the first opening with a protective first material, and then filling the lined first opening with a second material;
    after filling the lined first opening, forming a second stack over the first stack; the second stack having alternating first and second levels; the first levels comprising third material and the second levels comprising fourth material; the fourth material being insulative;
    forming a second opening to pass through the second stack and to the second material within the first opening;
    extending the second opening through the second material and to the protective first material;
    forming channel material within the extended second opening;
    forming a third opening to pass through the second stack, through the third layer, and to the second layer;
    lining sidewall surfaces of the third opening with protective fifth material;
    removing the second layer selectively relative to the first and third layers, and selectively relative to the protective fifth material; the removal of the second layer forming a conduit;
    forming conductively-doped semiconductor material within the conduit;
    out-diffusing dopant from the conductively-doped semiconductor material into the channel material, the out-diffused dopant migrating upwardly to at least a lowermost first level of the second stack; and
    replacing at least some of the third material with conductive material to form the first levels into conductive levels.

13. The method of claim 12 wherein the protective first material comprises silicon nitride, and wherein the second material comprises silicon dioxide and one or more of boron, phosphorus and fluorine.

14. The method of claim 12 wherein the protective first material comprises silicon nitride, and wherein the second material comprises borophosphosilicate glass.

15. The method of claim 12 wherein the protective first material consists essentially of silicon, and wherein the second material comprises tungsten.

16. The method of claim 12 wherein the protective fifth material consists essentially of silicon.

17. The method of claim 12 further comprising forming one or more cell materials within the extended second opening prior to forming the channel material.

18. The method of claim 17 wherein said one or more cell materials include tunneling material, charge-storage material and charge-blocking material.

19. The method of claim 17 further comprising extending the conduit through said one or more cell materials and to a sidewall surface of the channel material.

20. The method of claim 12 wherein the second opening is one of several substantially identical openings, wherein the channel material is configured as a channel material pillar; wherein the channel material pillar is one of several substantially identical channel material pillars; and wherein the third opening is a slit extending through a matrix of the channel material pillars.

21. The method of claim 20 wherein the channel materials pillars on a first side of the slit are within a first block region, and wherein the channel material pillars on an opposing second side of the slit are within a second block region.

22. The method of claim 21 comprising forming memory cells along the conductive levels, with the memory cells comprising regions of the channel material pillars; wherein the integrated assembly includes a memory device which comprises the memory cells; and wherein the metal-containing structure, the first layer, the third layer and the conductively-doped semiconductor material together form a source structure of the memory device.

23. The method of claim 22 further comprising forming a source-select device to comprise said lowermost first level.

24. The method of claim 12 wherein the first and third layers are a same composition as one another.

25. The method of claim 24 wherein said same composition is conductively-doped semiconductor material.

26. The method of claim 25 wherein the conductively-doped semiconductor material is conductively-doped silicon.

27. A method of forming an integrated assembly, comprising:
    forming a first stack over a metal-containing structure; the first stack comprising a first layer, a second layer over the first layer, and a third layer over the second layer; the first and third layers comprising conductively-doped silicon; the second layer comprising silicon dioxide;
    forming a first opening to extend through the first stack;
    forming a liner within the first opening to line the first opening;
    forming tungsten within the lined first opening;
    forming a second stack over the first stack; the second stack having alternating first and second levels;
    forming a second opening to pass through the second stack and to the tungsten;
    extending the second opening through the tungsten;
    forming first semiconductor material within the extended second opening;
    forming a third opening to pass through the second stack, through the third layer, and to the second layer;

lining sidewall surfaces of the third opening with protective material;
removing the silicon dioxide of the second layer to form a conduit;
forming conductively-doped second semiconductor material within the conduit;
out-diffusing dopant from the conductively-doped second semiconductor material into the first semiconductor material, the out-diffused dopant extending upwardly to at least one of the first levels;
forming conductive material within the first levels; and
forming insulative material within the third opening.

28. The method of claim 27 wherein the liner and the tungsten are formed over the first stack, and further comprising utilizing planarization to remove the tungsten from over the first stack.

29. The method of claim 28 wherein the planarization also removes the liner from over the first stack.

30. The method of claim 27 wherein the protective material consists essentially of silicon.

31. The method of claim 27 wherein the liner comprises a region consisting essentially of silicon.

32. The method of claim 31 wherein the liner comprises silicon dioxide over the region consisting essentially of silicon.

33. The method of claim 32 wherein the liner comprises titanium nitride over the silicon dioxide.

34. The method of claim 27 further comprising forming one or more cell materials within the extended second opening prior to forming the first semiconductor material.

35. The method of claim 34 wherein said one or more cell materials include tunneling material, charge-storage material and charge-blocking material.

36. The method of claim 34 further comprising extending the conduit through said one or more cell materials and to a sidewall surface of the first semiconductor material.

37. The method of claim 36 wherein the second opening is one of several substantially identical openings, wherein the first semiconductor material is configured as a channel material pillar; wherein the channel material pillar is one of several substantially identical channel material pillars; and wherein the third opening is a slit extending through a matrix of the channel material pillars.

38. The method of claim 37 wherein the channel materials pillars on a first side of the slit are within a first block region, and wherein the channel material pillars on an opposing second side of the slit are within a second block region.

39. The method of claim 37 comprising forming memory cells along the first levels, with the memory cells comprising regions of the channel material pillars and regions of the cell materials; wherein the integrated assembly includes a memory device which comprises the memory cells; and wherein the metal-containing structure, the first layer, the third layer and the conductively-doped second semiconductor material together form a source structure of the memory device.

40. The method of claim 39 further comprising forming a source-select device to comprise said at least one of the first levels.

41. An integrated structure, comprising:
a source structure comprising conductively-doped semiconductor material;
vertically-stacked conductive levels over the source structure; upper conductive levels of the vertically-stacked conductive levels being memory cell levels, and a lower conductive level of the vertically-stacked conductive levels being a select device level;
channel material extending vertically along the memory cell levels and the select device level; a region of the channel material under the select device level being a lower region of the channel material;
one or more memory cell materials between the channel material and the vertically-stacked conductive levels;
the one or more memory cell materials being along said lower region of the channel material;
a first liner region between the memory cell materials and the conductively-doped semiconductor material of an upper portion of the conductively-doped semiconductor material of the source structure;
a second liner region between the memory cell materials and the conductively-doped semiconductor material of a lower portion of the conductively-doped semiconductor material of the source structure; the first and second liner regions each comprising metal nitride; and
a gap between the first and second liner regions.

42. The integrated structure of claim 41 wherein the first and second liner regions comprise titanium nitride.

43. The integrated structure of claim 41 wherein the conductively-doped semiconductor material comprises conductive-doped silicon.

44. The integrated structure of claim 41 wherein the conductive levels comprise metal.

45. The integrated structure of claim 41 wherein the conductive levels are spaced from one another by intervening levels of silicon dioxide.

* * * * *

UNITED STATES PATENT AND TRADEMARK OFFICE
CERTIFICATE OF CORRECTION

PATENT NO. : 10,985,252 B2
APPLICATION NO. : 16/550638
DATED : April 20, 2021
INVENTOR(S) : Gordon A. Haller Page 1 of 1

It is certified that error appears in the above-identified patent and that said Letters Patent is hereby corrected as shown below:

In the Claims

Column 18, Lines 41-42 in Claim 43, - Replace "comprises conductive-doped silicon" with --comprises conductively-doped silicon--

Signed and Sealed this
Thirteenth Day of July, 2021

Drew Hirshfeld
*Performing the Functions and Duties of the
Under Secretary of Commerce for Intellectual Property and
Director of the United States Patent and Trademark Office*